US012696707B2

(12) United States Patent
Subbanna et al.

(10) Patent No.: US 12,696,707 B2
(45) Date of Patent: Jul. 28, 2026

(54) BATCH PROCESSING APPARATUS, SYSTEMS, AND RELATED METHODS AND STRUCTURES FOR EPITAXIAL DEPOSITION OPERATIONS

(71) Applicant: Applied Materials, Inc., Santa Clara, CA (US)

(72) Inventors: Manjunath Subbanna, Bangalore (IN); Ala Moradian, Sunnyvale, CA (US); Errol Antonio C. Sanchez, Tracy, CA (US); Zuoming Zhu, Sunnyvale, CA (US); Peydaye Saheli Ghazal, Saratoga, CA (US); Martin Jeffrey Salinas, San Jose, CA (US); Aniketnitin Patil, San Jose, CA (US); Raja Murali Dhamodharan, Madurai (IN); Shu-Kwan Lau, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 642 days.

(21) Appl. No.: 18/074,239

(22) Filed: Dec. 2, 2022

(65) Prior Publication Data

US 2024/0021444 A1 Jan. 18, 2024

(30) Foreign Application Priority Data

Jul. 12, 2022 (GR) ................................ 0220100554
Sep. 20, 2022 (IN) ............................ 202241053769

(51) Int. Cl.
*H01L 21/67* (2006.01)
*C23C 16/44* (2006.01)
(Continued)

(52) U.S. Cl.
CPC ...... *H10P 72/0402* (2026.01); *C23C 16/4412* (2013.01); *C23C 16/455* (2013.01);
(Continued)

(58) Field of Classification Search
CPC ......... H01L 21/67103; H01L 21/67098; H01L 21/67109; H01L 21/67739;
(Continued)

(56) References Cited

U.S. PATENT DOCUMENTS 8,673,081 B2 3/2014 Sivaramakrishnan et al.
9,620,395 B2 4/2017 Yang et al.
(Continued)

FOREIGN PATENT DOCUMENTS

CN 111725114 A 9/2020
CN 113990780 A 1/2022
(Continued)

OTHER PUBLICATIONS

International Search Report and Written Opinion dated May 12, 2023 for Application No. PCT/US2023/010921.
(Continued)

*Primary Examiner* — Joseph A Miller, Jr.
(74) *Attorney, Agent, or Firm* — Patterson + Sheridan, LLP

(57) ABSTRACT

The present disclosure relates to batch processing apparatus, systems, and related methods and structures for epitaxial deposition operations. In one implementation, an apparatus for substrate processing includes a cassette. The cassette is at least partially supported by a pedestal assembly. The cassette includes a plurality of levels arranged vertically with respect to each other, each level of the plurality of levels including a support surface configured to support a substrate. A level spacing between adjacent levels of the plurality of levels is 25 mm or higher, and the level spacing
(Continued)

is defined between the support surfaces of the adjacent levels.

20 Claims, 19 Drawing Sheets

(51) Int. Cl.

| | |
|---|---|
| *C23C 16/455* | (2006.01) |
| *C30B 25/14* | (2006.01) |
| *H10P 14/20* | (2026.01) |
| *H10P 14/24* | (2026.01) |
| *H10P 72/00* | (2026.01) |
| *H10P 72/30* | (2026.01) |
| *H10P 72/76* | (2026.01) |

(52) U.S. Cl.
 CPC ........ *C23C 16/45502* (2013.01); *C30B 25/14* (2013.01); *H10P 14/20* (2026.01); *H10P 14/24* (2026.01); *H10P 72/0431* (2026.01); *H10P 72/0432* (2026.01); *H10P 72/33* (2026.01); *H10P 72/7604* (2026.01)

(58) Field of Classification Search
 CPC . C23C 16/45502; C23C 16/455; C23C 16/46; C23C 16/4412; C30B 25/14
 See application file for complete search history.

(56) References Cited

U.S. PATENT DOCUMENTS

| | | | |
|---|---|---|---|
| 9,640,416 B2 | 5/2017 | Arai | |
| 9,871,350 B2 | 1/2018 | McLaurin et al. | |
| 9,875,895 B2 | 1/2018 | Yang et al. | |
| 10,161,036 B2 | 12/2018 | Hyon et al. | |
| 10,392,702 B2 | 8/2019 | Jung et al. | |
| 10,741,396 B2 | 8/2020 | Jung et al. | |
| 10,755,955 B2 | 8/2020 | Ishii et al. | |
| 10,903,625 B2 | 1/2021 | McLaurin et al. | |
| 11,111,580 B2 | 9/2021 | Kang et al. | |
| 2002/0005400 A1 | 1/2002 | Gat | |
| 2003/0049372 A1 | 3/2003 | Cook et al. | |
| 2006/0234178 A1 | 10/2006 | Hayashi et al. | |
| 2008/0173238 A1 | 7/2008 | Nakashima et al. | |
| 2009/0165713 A1 | 7/2009 | Kim et al. | |
| 2009/0217875 A1* | 9/2009 | Dietl ................ H01L 21/67115 118/725 |
| 2010/0068383 A1* | 3/2010 | Kato ................ C23C 16/45546 118/728 |
| 2018/0315626 A1 | 11/2018 | Franklin | |
| 2019/0348309 A1 | 11/2019 | Hsieh et al. | |
| 2021/0028075 A1 | 1/2021 | Zhu et al. | |
| 2021/0324514 A1 | 10/2021 | Ye et al. | |
| 2022/0081775 A1* | 3/2022 | Iriuda ............... H01L 21/67103 |
| 2022/0121196 A1 | 4/2022 | Omori | |
| 2022/0162751 A1 | 5/2022 | Haanstra et al. | |
| 2022/0170156 A1 | 6/2022 | Jdira et al. | |
| 2022/0181193 A1 | 6/2022 | Gao et al. | |
| 2022/0189804 A1 | 6/2022 | Luan et al. | |
| 2022/0199444 A1 | 6/2022 | Oosterlaken et al. | |
| 2022/0254668 A1 | 8/2022 | Oosterlaken et al. | |
| 2022/0268520 A1 | 8/2022 | Oosterlaken et al. | |
| 2022/0298643 A1 | 9/2022 | Kajbafvala et al. | |
| 2022/0298672 A1 | 9/2022 | M'Saad et al. | |
| 2022/0301829 A1 | 9/2022 | Yoshikawa | |
| 2022/0301905 A1 | 9/2022 | Ye et al. | |
| 2022/0301906 A1 | 9/2022 | Naik et al. | |
| 2022/0352006 A1 | 11/2022 | Huang et al. | |
| 2022/0359246 A1 | 11/2022 | Umeoka | |

FOREIGN PATENT DOCUMENTS

| | | |
|---|---|---|
| CN | 111893567 B | 2/2022 |
| CN | 114000192 A | 2/2022 |
| CN | 111254487 B | 3/2022 |
| CN | 114138030 A | 3/2022 |
| CN | 114158145 A | 3/2022 |
| CN | 114351249 A | 4/2022 |
| CN | 216357351 U | 4/2022 |
| CN | 110854044 B | 5/2022 |
| CN | 111235551 B | 5/2022 |
| CN | 114481311 A | 5/2022 |
| CN | 114540947 A | 5/2022 |
| CN | 114540948 A | 5/2022 |
| CN | 114551331 A | 5/2022 |
| CN | 114613703 A | 6/2022 |
| CN | 114743924 A | 7/2022 |
| CN | 114823428 A | 7/2022 |
| CN | 114855272 A | 8/2022 |
| CN | 114883221 A | 8/2022 |
| CN | 114914181 A | 8/2022 |
| CN | 114927450 A | 8/2022 |
| CN | 115020281 A | 9/2022 |
| CN | 115101432 A | 9/2022 |
| CN | 115101443 A | 9/2022 |
| CN | 115101470 A | 9/2022 |
| CN | 115233303 A | 10/2022 |
| CN | 115235257 A | 10/2022 |
| CN | 115274510 A | 11/2022 |
| CN | 115312432 A | 11/2022 |
| CN | 115404543 A | 11/2022 |
| JP | 2003168650 A | 6/2003 |
| JP | 2008294329 A | 12/2008 |
| JP | 2021028955 A | 2/2021 |
| KR | 20130141328 A | 12/2013 |
| WO | 2009109896 A1 | 9/2009 |
| WO | 2021176505 A1 | 9/2021 |
| WO | 2022031406 A1 | 2/2022 |
| WO | 2022031422 A1 | 2/2022 |
| WO | 2022064606 A1 | 3/2022 |

OTHER PUBLICATIONS

International Search Report and Written Opinion dated Jul. 31, 2023 for Application No. PCT/US2023/018182.
Korean Office Action dated Dec. 8, 2025 for Application No. 10-2025-7004520.
Japanese Office Action dated Dec. 9, 2025 for Application No. 2025-500813.

* cited by examiner

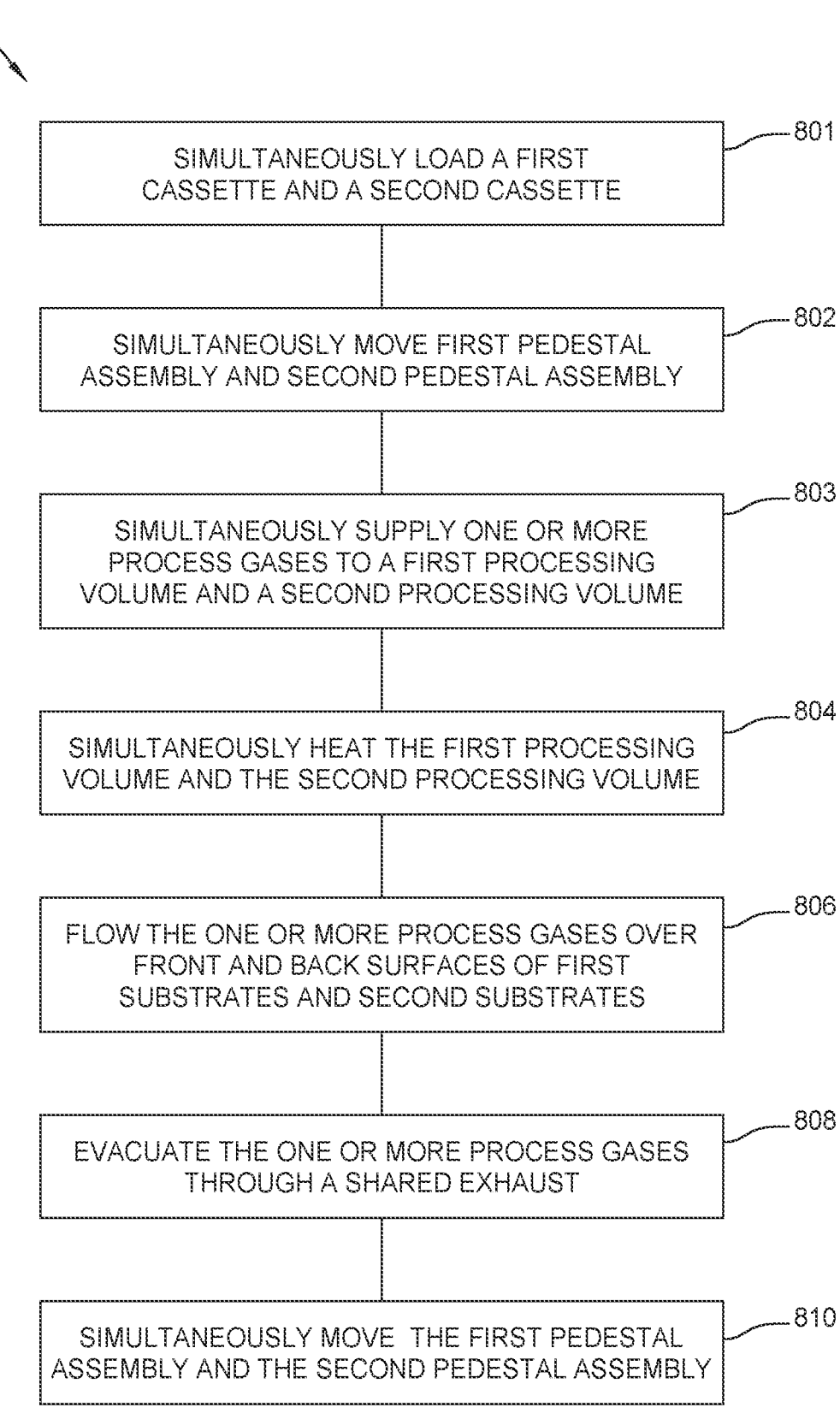

800

801 — SIMULTANEOUSLY LOAD A FIRST CASSETTE AND A SECOND CASSETTE

802 — SIMULTANEOUSLY MOVE FIRST PEDESTAL ASSEMBLY AND SECOND PEDESTAL ASSEMBLY

803 — SIMULTANEOUSLY SUPPLY ONE OR MORE PROCESS GASES TO A FIRST PROCESSING VOLUME AND A SECOND PROCESSING VOLUME

804 — SIMULTANEOUSLY HEAT THE FIRST PROCESSING VOLUME AND THE SECOND PROCESSING VOLUME

806 — FLOW THE ONE OR MORE PROCESS GASES OVER FRONT AND BACK SURFACES OF FIRST SUBSTRATES AND SECOND SUBSTRATES

808 — EVACUATE THE ONE OR MORE PROCESS GASES THROUGH A SHARED EXHAUST

810 — SIMULTANEOUSLY MOVE THE FIRST PEDESTAL ASSEMBLY AND THE SECOND PEDESTAL ASSEMBLY

POSITION A FIRST SUBSTRATE IN A
PROCESSING VOLUME — 1602

POSITION A SECOND SUBSTRATE IN THE
PROCESSING VOLUME AND AT A SUBSTRATE
SPACING — 1604

FLOW ONE OR MORE PROCESS GASES — 1606

HEAT THE FIRST SUBSTRATE AND THE SECOND
SUBSTRATE — 1608

DEPOSIT ONE OR MORE LAYERS — 1610

BATCH PROCESSING APPARATUS, SYSTEMS, AND RELATED METHODS AND STRUCTURES FOR EPITAXIAL DEPOSITION OPERATIONS

CROSS-REFERENCE TO RELATED APPLICATIONS

This application claims priority to Greece provisional patent application serial number 20220100554, filed Jul. 12, 2022, and claims priority to India provisional patent application serial number 202241053769, filed Sep. 20, 2022, both of which are herein incorporated by reference in their entireties.

BACKGROUND

Field

The present disclosure relates to batch processing apparatus, systems, and related methods and structures for epitaxial deposition operations.

Description of the Related Art

Semiconductor substrates are processed for a wide variety of applications, including the fabrication of integrated devices and microdevices. However, operations (such as epitaxial deposition operations) can be long and expensive, and can have limited capacity and throughput. Operations can also be limited with respect to film growth rates. Moreover, hardware can involve relatively large dimensions that occupy higher footprints in manufacturing facilities. Additionally, operations can involve hindrances with temperature control, gas control, and/or substrate center-to-edge control and adjustability. Such hindrances can be exacerbated in relatively complex processing operations.

Therefore, a need exists for an improved thermal process chamber in semiconductor processing.

SUMMARY

The present disclosure relates to batch processing apparatus, systems, and related methods and structures for epitaxial deposition operations.

In one implementation, an apparatus for substrate processing includes a chamber body that includes a processing volume, and a plurality of gas inject passages formed in the chamber body and in fluid communication with the processing volume. The chamber body includes one or more gas exhaust passages formed in the chamber body opposite the plurality of gas inject passages, and the one or more gas exhaust passages are in fluid communication with the processing volume. The apparatus includes one or more heat sources configured to generate heat, a pedestal assembly positioned in the processing volume, and a cassette positioned in the processing volume and at least partially supported by the pedestal assembly. The cassette includes a plurality of levels arranged vertically with respect to each other, each level of the plurality of levels including a support surface configured to support a substrate A level spacing between adjacent levels of the plurality of levels is 25 mm or higher, and the level spacing is defined between the support surfaces of the adjacent levels.

In one implementation, an apparatus for substrate processing includes a chamber body that includes a processing volume, a plurality of gas inject passages formed in the chamber body, and one or more gas exhaust passages formed in the chamber body opposite the plurality of gas inject passages. The apparatus include one or more heat sources configured to generate heat, a pedestal assembly positioned in the processing volume; and a flow guide structure positioned in the processing volume. The flow guide structure includes one or more first flow dividers that divide the processing volume into a plurality of flow levels. The flow guide structure includes one or more second flow dividers oriented to intersect the one or more first flow dividers and divide each flow level of the plurality of flow levels into a plurality of flow sections.

In one implementation, a method of processing a plurality of substrates includes positioning a first substrate in a processing volume of a chamber, the first substrate having a diameter. The method includes positioning a second substrate in the processing volume. The positioning of the second substrate incudes positioning the second substrate at a substrate spacing from the first substrate, the substrate spacing being a ratio of the diameter of the first substrate, and the ratio is 1:12 or higher. The method includes flowing one or more process gases into the processing volume, heating the first substrate and the second substrate, and simultaneously depositing one or more layers on each of the first substrate and the second substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

FIG. 8 illustrates operations of a method for batch processing a plurality of substrates, according to one implementation.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure relates to batch processing apparatus, systems, and related methods and structures for epitaxial deposition operations. In one or more embodiments, a processing apparatus includes a dual body that includes two processing volumes formed therein. The two processing volumes can share a gas panel and/or an exhaust pumping system, such as a pumping system having a pressure control valve and a vacuum pump. A dual body with a shared gas panel and/or a shared exhaust pump facilitates reduced equipment costs and reduced footprints of systems while facilitating enablement of simultaneous execution of processing operations on the two processing volumes. Each of the two processing volumes can include a respective cassette that supports a plurality of substrates during processing, thereby facilitating simultaneous execution of processing operations onto both plurality of substrates (in each processing volume) for increased throughput. The processing apparatus includes one or more side heating elements (e.g., side heat lamps, side resistive heaters, side LEDs, and/or side lasers, for example) disposed outwardly of the first processing volume, outwardly of the second processing volume, and/or between the first processing volume and the second processing volume. In one or more embodiments, a cassette supports a plurality of substrates, and a substrate spacing between at least two of the substrates is a ratio of a diameter of one or more of the substrates. The ratio is 1:12 or higher and/or the substrate spacing is 15 mm or higher. The substrate spacing facilitates simultaneously processing (e.g., batch processing) a plurality of substrates to increase throughput while reducing chamber footprint, increasing growth rates, and enhancing device performance. The substrate spacing also facilitates adjustability of process parameters.

The disclosure contemplates that terms such as "couples," "coupling," "couple," and "coupled" may include but are not limited to welding, fusing, melting together, interference fitting, and/or fastening such as by using bolts, threaded connections, pins, and/or screws. The disclosure contemplates that terms such as "couples," "coupling," "couple," and "coupled" may include but are not limited to integrally forming. The disclosure contemplates that terms such as "couples," "coupling," "couple," and "coupled" may include but are not limited to direct coupling and/or indirect coupling, such as indirect coupling through components such as links.

Figure 1:
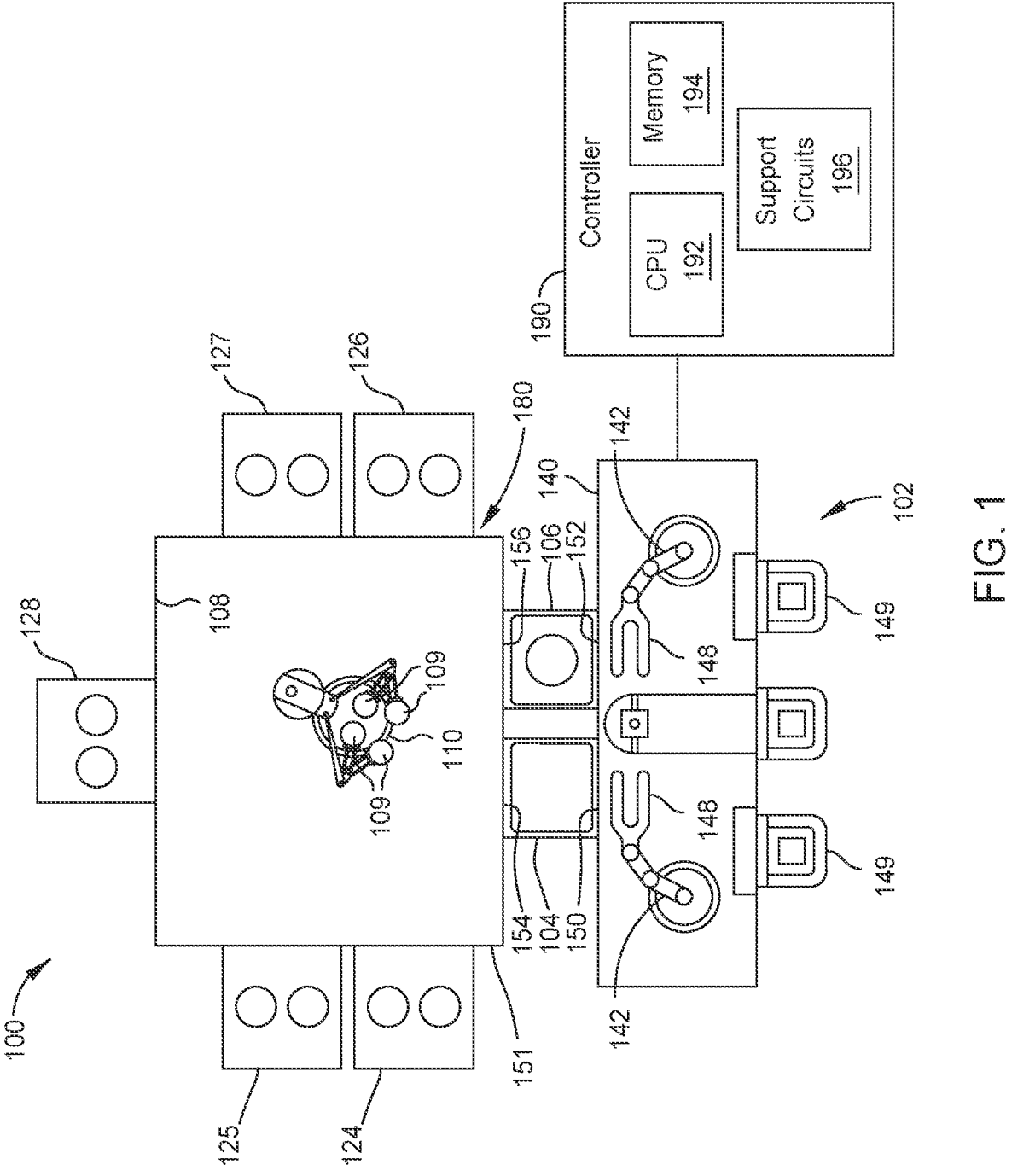
FIG. 1 is a schematic top diagram view of a system for processing substrates, according to one implementation.

FIG. 1 is a schematic top diagram view of a system 100 for processing substrates, according to one implementation. The system 100 includes a cluster tool 180. The cluster tool 180 includes a factory interface 102, one or more transfer chambers 108 (one is shown) with a transfer robot 110 disposed therein. The cluster tool 180 includes one or more processing chambers 124, 125, 126, 127 (four are shown) and one or more cleaning chambers 128 (one is shown)— such as a pre-clean chamber-mounted to a mainframe 151 of the single cluster tool 180. Two processing chambers are disposed on opposing sides of the transfer chamber 108, and one cleaning chamber 128 is included, in the implementation shown in FIG. 1. The present disclosure contemplates that a larger or smaller number of processing chambers and/or pre-clean chambers can be used. In one or more embodiments, the transfer robot 110 is configured to simultaneously load and unload a substrate to and from each of two processing volumes of one of the processing chambers 124, 125, 126, 127. In one or more embodiments, the transfer robot 110 is configured to simultaneously load and unload two or more substrates to and from each of two cassettes positioned in the two processing volumes of one of the processing chambers 124, 125, 126, 127. In the implementation shown in FIG. 1, the transfer robot 110 is configured to simultaneously load and unload at least four substrates 109.

In the implementation shown in FIG. 1, the factory interface 102 includes a docking station 140 and factory interface robots 142 to facilitate transfer of cassettes and/or substrates. The docking station 140 is configured to accept one or more front opening unified pods (FOUPs) 149. In one embodiment, which can be combined with other embodiments, each factory interface robot 142 includes a support structure 148 (such as a blade) configured to transfer cassettes and/or substrates from the factory interface 102 to the load lock chambers 104, 106. The load lock chambers 104, 106 have respective doors 150, 152 interfacing with the factory interface 102 and respective doors 154, 156 interfacing with transfer chamber 108. The one or more processing chambers 124, 125, 126, 127, 128 have respective doors interfacing with the transfer chamber 108. The doors can include, for example, slit openings with slit valves for passing cassettes and/or substrates therethrough by the transfer robot 110 and for providing a seal between respective chambers to prevent a gas from passing between the respective chambers. A door can be open for transferring a cassette and/or substrates therethrough, and otherwise closed.

The system 100 includes a controller 190 configured to control the system 100 or components thereof. For example, the controller 190 may control the operation of the system 100 using a direct control of the chambers 124, 125, 126, 127, 128 of the system 100 or by controlling controllers associated with the chambers 124, 125, 126, 127, 128. In operation, the controller 190 enables data collection and feedback from the respective chambers to coordinate and control performance of the system 100.

The controller 190 generally includes a central processing unit (CPU) 192, a memory 194, and support circuits 196. The CPU 192 may be one of any form of a general purpose processor that can be used in an industrial setting. The memory 194, or non-transitory computer readable medium, is accessible by the CPU 192 and may be one or more of memory such as random access memory (RAM), read only memory (ROM), floppy disk, hard disk, or any other form of digital storage, local or remote. The support circuits 196 are coupled to the CPU 192 and may include cache, clock circuits, input/output subsystems, power supplies, and the like.

The various methods (such as the method 800) and operations disclosed herein may generally be implemented under the control of the CPU 192 by the CPU 192 executing computer instruction code stored in the memory 194 (or in memory of a particular processing chamber) as, e.g., a software routine. When the computer instruction code is executed by the CPU 192, the CPU 192 controls the chambers to conduct operations in accordance with the various methods and operations described herein. In one embodiment, which can be combined with other embodiments, the memory 194 (a non-transitory computer readable medium) includes instructions stored therein that, when executed, cause the methods (such as the method 800) and operations (such as the operations 801, 802, 803, 804, 806, 808, 810) described herein to be conducted. The controller 190 can be in communication with the shared gas panel 208 and the shared pumping system (which can include the shared pump 210 and shared exhaust valve 273), for example, to cause a plurality of operations to be conducted.

Other processing systems in other configurations are contemplated. For example, more or fewer processing chambers may be coupled to a transfer apparatus. In the implementation shown in FIG. 1, the transfer apparatus includes the transfer chamber 108. In other implementations, more or fewer transfer chambers (e.g., one transfer chamber) may be implemented as a transfer apparatus in a system for processing substrates.

Figure 2:
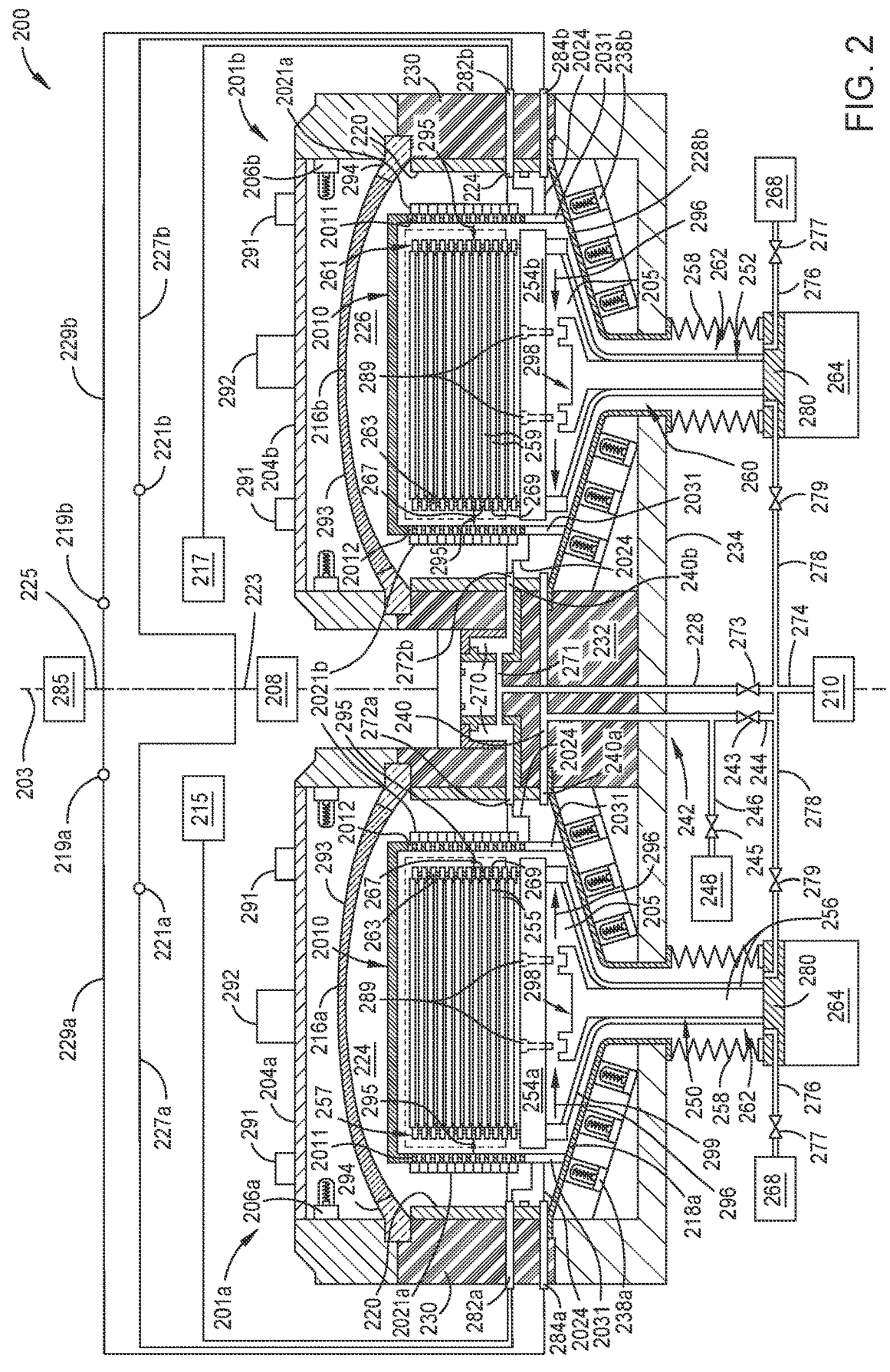
FIG. 2 is a schematic cross-sectional side view of a processing apparatus according to one implementation.
Figure 5A:
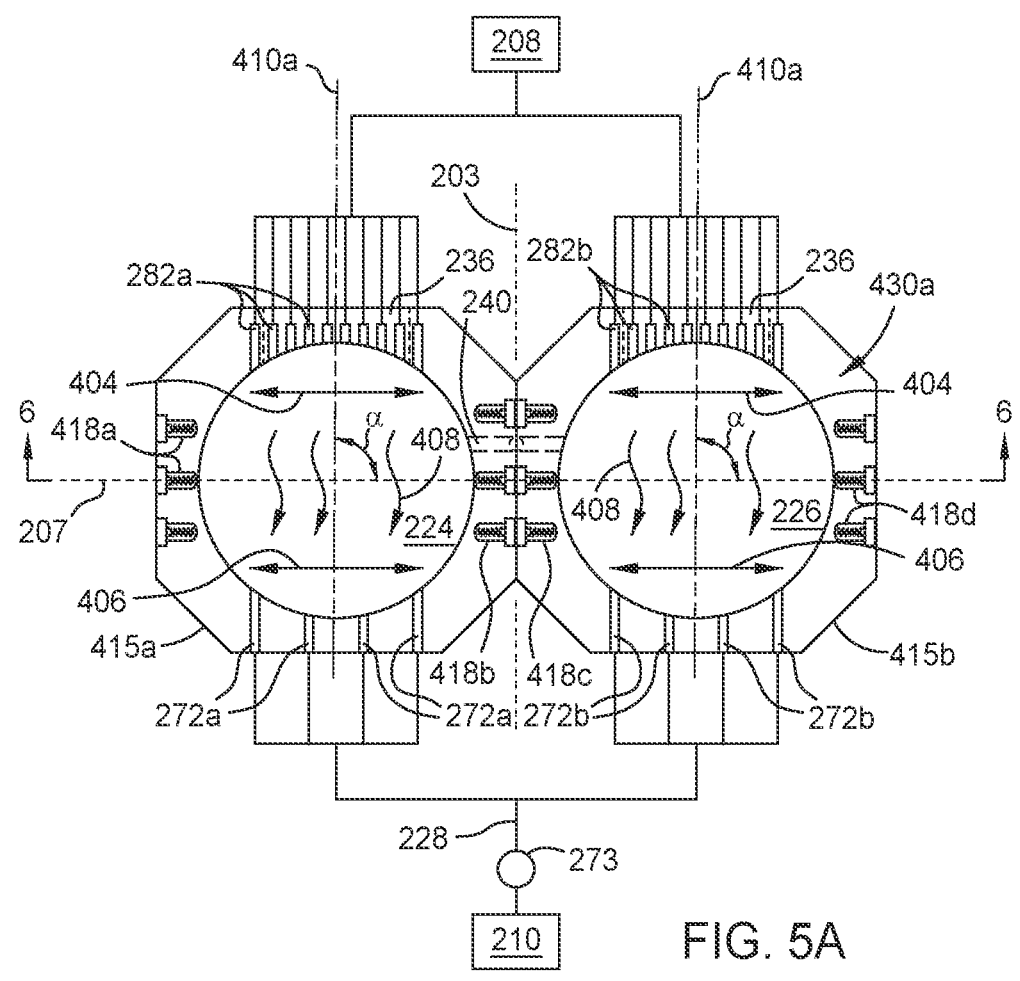
FIG. 5A is a schematic top plan view of a chamber body, which can be used as the chamber body shown in FIG. 2, according to one implementation.

FIG. 2 is a schematic cross-sectional side view of a processing apparatus 200 according to one implementation. The processing apparatus 200 can be used, for example, as at least part of the processing chambers 124, 125, 126, 127 shown in FIG. 1. The cross-sectional view shown in FIG. 2 is taken along Section 2-2 shown in FIG. 5E. The side heat sources 418a-418d shown in FIG. 5E are not shown in FIG. 2 for visual clarity purposes. The processing apparatus 200 includes a processing chamber having a first chamber side 201a and a second chamber side 201b. Each chamber side 201a, 201b defines a respective processing volume 224, 226. The first chamber side 201a and the second chamber side 201b are substantially identical to each other (e.g., mirror images of one another). The chamber sides 201a, 201b share a chamber body 230 and a chamber body bottom 234. The chamber sides 201a, 201b may additionally include a shared lid (not shown). The chamber sides 201a, 201b are mirror images of one another relative to a reference plane 203. The reference plane 203 is a central plane that divides the processing chamber.

The first chamber side 201a defines a first processing volume 224 for processing a plurality of first substrates 255 supported by a first cassette 257. The first chamber side 201a includes a first upper window 216a, such as a dome, disposed between the first lid 204a and the first processing volume 224. The first chamber side 201a includes a first lower window 218a disposed below the first processing volume 224. One or more first upper radiant heat sources 206a are positioned above the first processing volume 224 and the first upper window 216a. The one or more first upper radiant heat sources 206a can be radiant heat sources such as lamps, for example halogen lamps. The present disclosure contemplates that other heat sources may be used (in addition to or in place of the lamps) for the various heat sources described herein. For example, resistive heaters, light emitting diodes (LEDs), and/or lasers may be used for the various heat sources described herein. The one or more first upper heat sources 206a are disposed between the first upper window 216a and the first lid 204a. The first upper heat sources 206a are positioned to provide uniform heating of the first substrates 255. One or more first lower heat sources 238a are positioned below the first processing volume 224 and the first lower window 218a. The first lower heat sources 238a are disposed between the first lower window 218a and a chamber body bottom 234. The first lower heat sources 238a are positioned to provide uniform heating of the first substrates 255.

The second chamber side 201b defines a second processing volume 226 for processing a plurality of second substrates 259 supported by a second cassette 261. The second chamber side 201b includes a second upper window 216b, such as a dome. The second upper window 216b is disposed between the second lid 204b and the second processing volume 226. The second chamber side 201b includes a second lower window 218b, such as a dome disposed below the second processing volume 226. One or more second upper heat sources 206b are positioned above the second processing volume 226 and the second upper window 216b. The second upper heat sources 206b are disposed between the second upper window 216b and the second lid 204b. The second upper heat sources 206b are positioned to provide predetermined heating of the second substrates 259. One or more second lower heat sources 238b are positioned below the second processing volume 226 and the second lower window 218b. The second lower heat sources 238b are disposed between the second lower window 218b and a chamber body bottom 234. The second lower heat sources 238b are positioned to provide predetermined heating of the second substrates 259.

Each of the first and second cassettes 257, 261 respectively includes a plurality of levels corresponding to the respective plurality of substrates 255, 259. Each level of each cassette 257, 261 includes one or more arcuate supports 263. Each arcuate support 263 has a first inner ledge 265 supporting one of the respective first substrates 255 or second substrates 259. Each level of each cassette 257, 261 includes an upper opening 267 above the one or more arcuate supports 263, and a lower opening 269 below the one or more arcuate supports 263. Each arcuate support 263 can include a unitary structure such as a ring or can include two structures spaced from each other. Each cassette 257, 261 can simultaneously support two or more substrates 255, 259 for processing (such as twelve or more substrates 255, 259 each). In the implementation shown in FIG. 2, each cassette 257, 261 supports twelve substrates 255, 259. Each cassette 257, 261 can support two substrates 255, 259, three substrates 255, 259, or six substrates 255, 259.

The first and second upper windows 216a, 216b and the first and second lower windows 218a, 218b may be transparent to the infrared radiation, such as by transmitting at least 95% of infrared radiation. The first and second upper windows 216a, 216b and the first and second lower windows 218a, 218b may be a quartz material. In one or more embodiments, each of the first and second upper windows 216a, 216b includes an inner window 293 and outer window supports 294. The inner window 293 may be a thin quartz window that partially defines the processing volumes 224, 226. The outer window supports 294 support the inner window 293 and are at least partially disposed within a support groove 304 (see FIGS. 3 and 4). In one or more embodiments, the first and second upper windows 216a, 216b may be a single window, such that there is a single upper window assembly 900 (see FIG. 9) disposed above both the first chamber side 201a and the second chamber side 201b. The single upper window assembly 900 may assist in eliminating pressure gradients across the first and second chamber sides 201a, 201b and reduce temperature gradients across a single upper window 916. As an example, a single upper radiant heat assembly (such as a plurality of lamps coupled to a single lamp header) could be used that spans both processing volumes 224, 226. The single upper window 916 can reduce or eliminate the need for a center wall, such as the center wall 232, which facilitates reduced or eliminated pressure gradients. The center wall 232 can be modified to partially divide the first processing volume 224 from the second processing volume 226. As an example, the center wall 232 can be modified to include a gap (e.g., similar to the gap shown between the first inner window 912a and the second inner window 912b in FIG. 9) that fluidly connects the two processing volumes 224, 226. One or more passages (such as the equalization port 240) can be formed through the center wall 232 to fluidly connect the two processing volumes 224, 226, which facilitates reduced or eliminated pressure gradients. The single upper window 916 is described in greater detail in FIG. 9 and the accompanying text.

The processing apparatus 200 includes first and second pedestal assemblies 250 and 252, which are disposed in the first and second processing volumes 224, 226, respectively. Liners 220 are disposed within each of the first and second chamber sides 201a, 201b and surround each of the pedestal assemblies 250, 252. The pedestal assembly 250 is disposed at least partially within the first chamber side 201a and the pedestal assembly 252 is disposed at least partially within the second chamber side 201b. A liner 220 shields a chamber body 230 from processing chemistry in the first and second processing volumes 224, 226. Each of the first and second chamber sides 201a, 201b includes a liner 220. The chamber body 230 is disposed between the upper window 216 and the lower window 218. The liner 220 is disposed in the first and second chamber sides 201a and 201b. Each of the liners 220 is disposed between one of the processing volumes 224, 226 and the chamber body 230. An exhaust plenum 270 partially surrounds the processing volumes 224, 226 and one or more exhaust ports 272a, 272b are formed through the liners 220 connecting the exhaust plenum 270 and the processing volumes 224, 226.

The first and second chamber sides 201a, 201b share a gas panel 208 and a pump 210, such as a vacuum pump. The gas panel 208 may be two individual gas panels or a shared gas panel. Both of the first and the second chamber sides 201a, 201b are provided with gas by the same gas panel 208 when a shared gas panel 208 is utilized. The gas panel 208 provides process gases to the first and second processing volumes 224, 226 through the conduit 223 and the first and second gas inject passages 282a, 282b. The gas panel 208 distributes gas evenly between the first processing volume 224 and the second processing volume 226. The gas panel 208 connects to a conduit 223. The conduit 223 splits into two additional conduits 227a, 227b. The conduit 223 may include a split controller. The split controller (not shown) is disposed between the conduit 223 and the conduits 227a, 227b. The split controller controls the flow of gases to each of the conduits 227a, 227b. In one or more embodiments, the split controller includes a valve or mass flow controller. The two additional conduits 227a, 227b distribute gas from the conduit 223 to the first and second gas inject passages 282a, 282b respectively. The conduits 227a, 227b have restrictors 221a, 221b disposed therein. The restrictors 221a, 221b control the flow of the process gasses through the conduits 227a, 227b. The restrictors 221a, 221b may additionally measure the flow of the process gasses through the conduits 227a, 227b. The restrictors 221a, 221b control the flow of the process gasses that are flowing from the gas panel 208 and balance the process gas flow, so that the process gas flow is the same in both of the conduits 227a, 227b. The restrictors 221a, 221b, may be, for example, valves, mass flow controllers, or other restriction devices. The restrictors 221a, 221b may be used in addition to or in place of the precise split controller (not shown) coupled to the conduit 223. Gases that can be supplied by the gas panel 208 include processing gases such as purge gases, cleaning gases, and/or deposition gases. The deposition gases can include, for example, one or more reactant gases carried in one or more carrier gases.

The first and second chamber sides 201a, 201b further include a first individual gas panel 215 and a second individual gas panel 217. The first individual gas panel 215 provides process gasses to the first processing volume 224 through the first gas inject passages 282a. The second individual gas panel 217 provides process gasses to the second processing volume 226 through the second gas inject passages 282b. The first and second individual gas panels 215, 217 are utilized if the restrictors 221a, 221b are unable to properly balance the process gas flow from the shared gas panel 208 or if a supplemental gas is used for a particular process. Gases that may be supplied by the first and second individual gas panels 215, 217 include deposition gases. In one or more embodiments, both the shared gas panel 208 and the first and second individual gas panels 215, 217 are utilized. In one or more embodiments, the shared gas panel 208 is utilized and the first and second individual gas panels 215, 217 are omitted. In one or more embodiments, both the first and the second individual gas panels 215, 217 are utilized. In embodiments in which as least some process gases are supplied by the shared gas panel 208, the cost of the gas injection system may be decreased.

The first chamber side 201a is in fluid communication with the gas panel 208 via a first gas inject passage 282a. The first gas inject passage 282a is in fluid communication with the first processing volume 224 such that the first gas inject passage 282a provides process gas to the first processing volume 224 from the gas panel 208.

In operation, process gas supplied from the gas panel 208 is introduced into the first processing volume 224 through the first gas inject passage 282a formed in the sidewall of the chamber body 230 such that the gas panel 208 is a process gas panel. The first gas inject passage 282a is configured to direct the process gas in a generally radially inward direction towards the first pedestal assembly 250. As such, in one or more embodiments, the first gas inject passage 282*a* may be a cross-flow gas injector. The cross-flow gas injector is positioned to direct the process gas across a front surface of each first substrate 255, a back surface of each first substrate 255, and/or one or more supporting surfaces of a first pedestal 254*a* positioned in the first processing volume 224. During a film formation process, the one or more supporting surfaces of the first pedestal 254*a* are located in the processing position, which is adjacent to and at about the same elevation as the first gas inject passage 282*a*, which can facilitate the process gas to flow generally along flow path 295 across the front and back surfaces of the first substrates 255 and/or across the one or more supporting surfaces of the first pedestal 254*a*. The process gas exits the first processing volume 224 through the first exhaust ports 272*a* located on the opposite side of the first processing volume 224 relative to the first gas inject passage 282*a*. Removal of the process gas through the first exhaust ports 272*a* may be facilitated by the vacuum pump 210.

The gas panel 208 is in fluid communication with a second gas inject passage 282*b*. The second gas inject passage 282*b* is in fluid communication with the second processing volume 226, such that the second gas inject passage 282*b* provides process gas to the second processing volume 226 from the gas panel 208.

Process gas supplied from the gas panel 208 is introduced into the second processing volume 226 through the second gas inject passage 282*b* formed in the sidewall of the chamber body 230. The second gas inject passage 282*b* is configured to direct the process gas in a generally radially inward direction. As such, in one or more embodiments, the second gas inject passage 282*b* may be a cross-flow gas injector. The cross-flow gas injector is positioned to direct the process gas across a front surface of each second substrate 259, a back surface of each second substrate 259, and/or one or more supporting surfaces of a second pedestal 254*b* positioned in the second processing volume 226. During a film formation process, the one or more supporting surfaces of the second pedestal 254*b* are located in the processing position, which is adjacent to and at about the same elevation as the second gas inject passage 282*b*, which can facilitate the process gas to flow generally along flow path 295 across the front and back surfaces of the second substrates 259 and/or the one or more supporting surfaces of the second pedestal 254*b*. The process gas exits the second processing volume 226 through the second exhaust ports 272*b* located on the opposite side of the second processing volume 226 relative to the second gas inject passage 282*b*. Removal of the process gas through the second exhaust ports 272*b* may be facilitated by the vacuum pump 210.

Purge gas supplied from a purge gas source 285 is introduced to the bottom regions 205 of the both the first and second processing volumes 224, 226 through first and second purge gas inlets 284*a*, 284*b* formed in the sidewall of the chamber body 230.

The purge gas source 285 is in fluid communication with a conduit 225. The conduit 225 transfers the purge gas from the purge gas source 285. The conduit 225 splits into two additional conduits 229*a*, 229*b*. The conduits 229*a*, 229*b* connect the conduit 225 to the first and second purge gas inlets 284*a*, 284*b*. The purge gas source 285 is in fluid communication with the first and second purge gas inlets 284*a*, 284*b* through the conduit 225 and the conduits 229*a*, 229*b*. The first purge gas inlets 284*a* is in fluid communication with the conduit 229*a* and the second purge gas inlets

284*b* are in fluid communication with the conduit 229*b*. The purge gas flow through the conduits 229*a*, 229*b* is balanced using the first and second purge gas restrictors 219*a*, 219*b*. The first and second purge gas restrictors 219*a*, 219*b* balance the flow so that the flow through each of the conduits 229*a*, 229*b* is the same.

The first purge gas inlet 284*a* is disposed at an elevation below the first gas inject passage 282*a*. If the liner 220 is used, a section of the liner 220 may be disposed between the first gas inject passage 282*a* and the first purge gas inlet 284*a*. In either case, the first purge gas inlet 284*a* is configured to direct the purge gas in a generally radially inward direction. The first purge gas inlet 284*a* may be configured to direct the purge gas in an upward direction. During a film formation process, the first pedestal assembly 250 is located at a position that can facilitate the purge gas to flow generally along a flow path 296 across a back side of the first pedestal 254*a*. The purge gas exits the bottom region 205 and is exhausted out of the process chamber through the first exhaust port 272*a* located on the opposite side of the first processing volume 224 relative to the first purge gas inlet 284*a*.

The second purge gas inlet 284*b* is disposed at an elevation below the second gas inject passage 282*b*. If the liner 220 is used, a section of the liner 220 may be disposed between the second gas inject passage 282*b* and the second purge gas inlet 284*b*. In either case, the second purge gas inlet 284*b* is configured to direct the purge gas in a generally radially inward direction. The second purge gas inlet 284*b* may be configured to direct the purge gas in an upward direction. During a film formation process, the second pedestal assembly 252 is located at a position that can facilitate the purge gas to flow generally along a flow path 296 across a back side of the second pedestal 254*b*. The purge gas exits the bottom region 205 and is exhausted out of the process chamber through the second exhaust port 272*b* located on the opposite side of the second processing volume 226 relative to the second purge gas inlet 284*b*.

A pump 210 (such as a vacuum pump) is in fluid communication with the exhaust plenum 270 so that the processing volumes 224, 226 can be pumped out through the plurality of exhaust ports 272*a*, 272*b* and the exhaust plenum 270. The exhaust plenum 270 is coupled to a shared exhaust conduit 271 that is shared by the first processing volume 224 and the second processing volume 226. The shared exhaust conduit 271 connects to a second shared exhaust conduit 228, which extends through the chamber body bottom 234 to a shared pump conduit 274. The shared pump conduit 274 is coupled to the pump 210 to facilitate the pumping of gases from the shared exhaust conduit 271. A shared exhaust valve 273 is disposed on the pump conduit 274 between the shared exhaust conduit 271 and the pump 210. The shared exhaust valve 273 may be opened or closed depending on desired pumping operation. The shared exhaust valve 273 can be a pressure control valve.

Each pedestal assembly 250, 252 includes a respective first support frame 298 and a respective second support frame 299 disposed at least partially about the first support frame 298. The second support frames 299 includes arms coupled to the respective pedestal 254*a*, 254*b* and/or respective cassette 257, 261 such that lifting and lowering the second support frames 299 lifts and lowers the respective pedestal 254*a*, 254*b* and/or respective cassette 257,261. A plurality of lift pins 289 are suspended from each pedestal 254*a*, 254*b*. Lowering of the respective pedestal 254*a*, 254*b* initiates contact of the lift pins 289 with arms of the respective first support frame 298. Continued lowering of the respective pedestal 254a, 254b initiates contact of the lift pins 289 with the substrates in the respective cassette 257, 261 such that the lift pins 289 raise the substrates in the respective cassette 257, 261. A bottom region 205 of the chamber sides 201a, 201b is defined between the chamber body bottom 234 and the first and second pedestals 254a, 254b. A stem 256 of each support frame 298, 299 extends through a bottom 234 of the chamber body 230. The stems 256 are coupled to a respective motor 264, which is configured to independently raise, lower, and/or rotate each of the first and second pedestals 254a, 254b. The present disclosure contemplates that the respective motors 264 may be driven by a shared power source such that the first and second pedestals 254a, 254b move simultaneously and in an identical manner. The present disclosure contemplates that the stems 256 may be coupled to a shared motor 264 such that the first and second pedestals 254a, 254b move simultaneously and in an identical manner.

Pedestal bellows ports 260 are formed in the bottom 234 of the chamber body 230. The pedestal bellows ports 260 extend through the bottom 234 of the chamber body 230. Each pedestal bellows port 260 has a diameter larger than a diameter of the stem 256 and circumscribes each stem 256 where the stem 256 extends through the bottom 234 of the chamber body 230. The pedestal bellows ports 260 circumferentially surround the stems 256. A bellows assembly 258 is disposed around each pedestal bellows port 260 to facilitate reduced or eliminated vacuum leakage outside the chamber body 230. Each of the bellows assemblies 258 circumscribe and enclose a portion of the stems 256 disposed outside the chamber body 230. The bellows assemblies 258 are coupled between an exterior surface of the bottom 234 of the chamber body 230 and a base member 280. The base member 280 may house the motor 264 and a portion of the stem 256, which is coupled to the motor 264. The bellows assemblies 258 may be formed from a metallic or metallized material and be configured to form a gas flow channel 262. The gas flow channel 262 is defined as a region between the outer stem 256 and the bellows assembly 258. The gas flow channel 262 extends from the pedestal bellows port 260 to the base member 280. As such, the gas flow channel 262 forms a hollow cylindrically shaped passage between the bellows assembly 258 and the stem 256. The gas flow channel 262 is fluidly coupled between the bottom region 205 and an exhaust conduit 278. The exhaust conduit 278 extends from the gas flow channel 262 through the base member 280 to the pump conduit 274. A valve 279 is disposed along the exhaust conduit 278 and between the gas flow channel 262 and the pump conduit 274. When the valve 279 is closed, pumping via the exhaust plenum 270 may proceed and when the valve 279 is open, pumping via the pedestal bellows port 260 may proceed. When the valve 279 is open, the shared exhaust valve 273 may be closed to enhance pumping of the bottom region 205 via the pedestal bellows port 260.

In one or more embodiments of a pumping process, the bottom regions 205 of each chamber side 201a, 201b are pumped via the pedestal bellows port 260. Gases and particles present in the bottom region 205 travel through the pedestal bellows port 260, the gas flow channel 262 and the exhaust conduit 278 to the vacuum pump 210. In such an embodiment, the shared exhaust valve 273 is closed and the valve 279 is open so that the pump 210 is in fluid communication with the bottom region 205. The pumping via the pedestal bellows port 260 is performed during a chamber cleaning process, for example, when the chamber is idle and not processing substrates. An inert gas may also be provided to the chamber sides 201a, 201b during the pedestal bellows pumping process. For example, argon is provided to both chamber sides 201a, 201b from one of the gas panel 208 or the purge gas source 285 for each chamber side 201a, 201b. It is believed that the argon provided via the gas panel 208 or purge gas source 285 enables more efficient cleaning and pumping of the bottom region 205.

In one or more embodiments, a gas source 268 is fluidly coupled to each of the bottom regions 205 via the gas flow channel 262 and the pedestal bellows port 260. The gas source 268 may be configured to deliver an inert gas or a cleaning gas to the bottom region 205. Although schematically shown as being in close physical proximity with the processing apparatus 200, the gas source 268 is generally a remote gas source located remotely from the processing apparatus 200. The gas source 268 is coupled to a conduit 276, which extends from the gas source 268 through the base member 280. The conduit 276 is in fluid communication with the gas flow channel 262. A valve 277 is disposed on the conduit 276 between the gas source 268 and the base member 280.

In one or more embodiments, an inert gas, or purge gas, is provided to the bottom region 205. In operation, the purge gas is provided to the bottom region 205 along a flow pathway from the gas source 268, through the conduit 276 with the valve 277 opened, through the gas flow channel 262 and through the pedestal bellows port 260. The purge gas is provided from the gas source 268 during processing of a substrate in the chamber sides 201a, 201b. Suitable purge gases include inert gases, such as helium, neon and argon. However, other unreactive gases may also be utilized. It is believed that flowing the purge gas during processing of substrates prevents particles and contaminants from falling below the supporting surface 254 and depositing on surfaces of the chamber sides 201a, 201b which define the bottom region 205. During purging via the pedestal bellows port 260, pumping of the chamber sides 201a, 201b proceeds via the exhaust plenum 270 and the vacuum pump 210. The plurality of exhaust ports 272 and at least a portion of the exhaust plenum 270 are substantially coplanar with the supporting surface 254. Pumping via the exhaust plenum 270 draws the purge gas from the bottom region 205. In such an embodiment, the purge gas and contaminants are exhausted from the chamber sides 201a, 201b without the contaminants falling below the supporting surface 254. It is contemplated, however, that pumping and purging through the bellows assembly 258 may be omitted. In such an example, the corresponding hardware for pumping and purging through the bellows assembly 258 may also be omitted.

The processing apparatus 200 also includes an equalization port 240 which is disposed through a center wall 232 of the processing apparatus 200. The center wall 232 divides the chamber sides 201a, 201b and defines at least a portion of the bottom region 205. The equalization port 240 includes a first opening 240a in fluid communication with the bottom region 205 of the first chamber side 201a. The equalization port 240 further includes a second opening 240b in fluid communication with the bottom region 205 of the second chamber side 201b. Each of the first opening 240a and the second opening 240b are disposed on opposite sides of the equalization port 240 and in fluid communication with each other. The equalization port 240 may be formed in the center wall 232 or through a region of the chamber body 230 defining the bottom region 205. The equalization port 240 is disposed below the one or more supporting surfaces of the first pedestal 254a, below the one or more supporting surfaces of the second pedestal 254b, and below the exhaust plenum 270. The equalization port 240 extends from the bottom region 205 of each chamber side 201a, 201b through the center wall 232 and enables the bottom region 205 of each chamber side 201a, 201b to be in fluid communication with one another.

A conduit 244 extends from the equalization port 240 through the center wall 232 and exits the bottom 234 of the chamber body 230 at an exit port 242. The conduit 244 fluidly couples the equalization port 240 with the exhaust conduit 278. A valve 243 is disposed along the conduit 244 and between the exit port 242 and the exhaust conduit 278. When the valve 243 is open, the bottom region 205 is in fluid communication with the vacuum pump 210. In one or more embodiments, the bottom region 205 is exhausted by an equalization port pumping process. The equalization port pumping process is conducted while the chamber sides 201a, 201b are idle, such as during an idle cleaning process. To enable pumping via the equalization port 240, the exhaust valve 273 is closed and the valve 243 is opened. As such, the vacuum pump 210 is in fluid communication with the bottom region 205 via the conduit 244 and the equalization port 240. As a result of the exhaust valve 273 being closed, exhausting of the chamber sides 201a, 201b proceeds via the equalization port 240 and not through the exhaust plenum 270. During the equalization port pumping process, the vacuum pump 210 exhausts gases and contaminants from the bottom region 205 through the equalization port 240 and conduit 244. An inert gas may also be provided to the chamber sides 201a, 201b during the equalization port 240 pumping process. For example, argon is provided to both chamber sides 201a, 201b from the gas panel 208. It is believed that the argon provided via the gas panel 208 facilitates more efficient cleaning and pumping of the bottom region 205. Pumping via the equalization port 240 removes undesirable contaminants from the bottom region 205 without utilizing the exhaust plenum 270, which provides increased functionality of the processing apparatus 200.

The equalization port 240 additionally facilitates equalizing the pressure between each of the chamber sides 201a, 201b during substrate processing. Equalizing the pressures within the chamber sides 201a, 201b allows for more consistent and uniform deposition results between the processed substrates within each of the chamber sides 201a, 201b.

In one or more embodiments, a gas source 248 is fluidly coupled to the bottom regions 205 via the conduit 244 and the equalization port 240. The gas source 248 may be configured to deliver an inert gas or a cleaning gas to the bottom regions 205. Although schematically shown as being in close physical proximity with the processing apparatus 200, the gas source 248 is generally a remote gas source located remotely from the processing apparatus 200. The gas source 248 is coupled to a conduit 246 which extends from the gas source 248 to the conduit 244. A valve 245 is disposed on the conduit 246 between the gas source 248 and the conduit 244. In one or more embodiments, an inert gas, or purge gas, is provided to the bottom regions 205. In operation, the purge gas is provided to the bottom regions 205 along a flow pathway from the gas source 248, through the conduit 246 with the valve 245 opened, the conduit 244, and the equalization port 240. The purge gas is provided from the gas source 248 during an idle cleaning process. Suitable purge gases include inert gases, such as helium, neon and argon. However, other unreactive gases may also be utilized.

Figure 6:
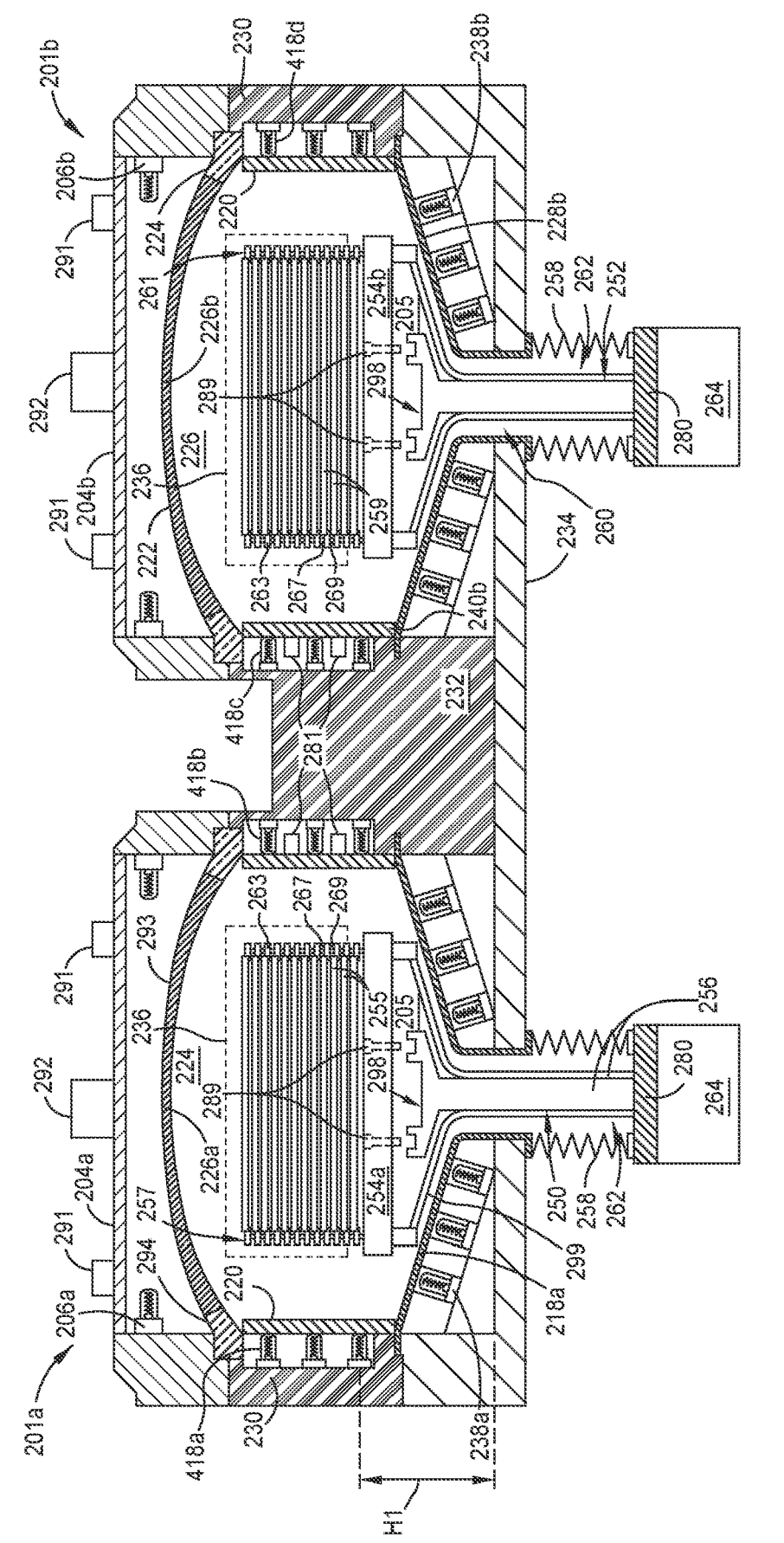
FIG. 6 is a schematic cross-sectional side view of a processing apparatus according to one implementation.

An opening 236 is formed through one or more sidewalls of each of the first and second chamber sides 201a, 201b (see FIG. 6). The openings 236 may be used to transfer the substrates 255, 259 to or from the cassettes 257, 261, e.g., in and out of the first and second processing volumes 224, 226. In one or more embodiments, the openings 236 each include a slit valve. In one or more embodiments, the openings 236 may be connected to any suitable valve that enables the passage of substrates therethrough.

Each of the first and second chamber sides 201a, 201b of the dual-chamber may include one or more temperature sensors 291, 292, such as optical pyrometers, which measure temperatures within the first and second chamber sides 201a, 201b (such as on the surfaces of upper windows 216a, 216b, one or more surfaces of the substrates 255, 259 and/or the cassettes 257, 261). The one or more temperature sensors 291, 292 are disposed on the first and second lids 204a, 204b.

In the implementation shown in FIG. 2, one or more heat shields 2010 are disposed about the cassette 257 and the first substrates 255, and about the second cassette 261 and the second substrates 259. Each of the one or more heat shields 2010 is formed of one or more of silicon carbide (SiC), quartz, and/or graphite coated with silicon carbide (SiC). The one or more heat shields 2010 include a plurality of inlet openings 2011 fluidly connected to the gas inject passages 282a, 282b and a plurality of outlet openings 2012 fluidly connected to the exhaust port 272a, 272b. Each inlet opening 2011 and each outlet opening 2012 is aligned horizontally with an opening (such as one of the upper openings 267 and the lower openings 269) that is above, below, and/or between substrates 255, 259. The inlet openings 2011 are in fluid communication with the first and second gas inject passages 282a, 282b through a plurality of inlet lines 2021a, 2021b. The outlet openings 2012 are in fluid communication with the exhaust ports 272a, 272 be through a plurality of outlet lines 2022a, 2022b. The process gases flow from the gas inject passages 282a, 282b, through the inlet lines 2021a, 2021b, through the inlet openings 2011, and to the substrates 255, 259. The process gases flow through the outlet openings 2012, through the outlet lines 2022a, 2022b, and to the exhaust ports 272a, 272b after the process gases flow over front and back surfaces of the substrates 255, 259. Gases, such as purge gases, can flow through one or more channels 2031 under the gas inlets 2011 and the gas outlets 2012. The one or more channels 2031 are in fluid communication with the gas inject passages 282a, 282b and/or the 284a, 284b through one or more purge inlet lines 2023. The one or more channels 2031 are in fluid communication with the exhaust ports 272a, 272b through one or more purge outlet lines 2024. In the implementation shown in FIG. 2, one or more heat shields 2010 are disposed in the first processing volume 224, and one or more heat shields 2010 are disposed in the second processing volume 226.

Figure 3:
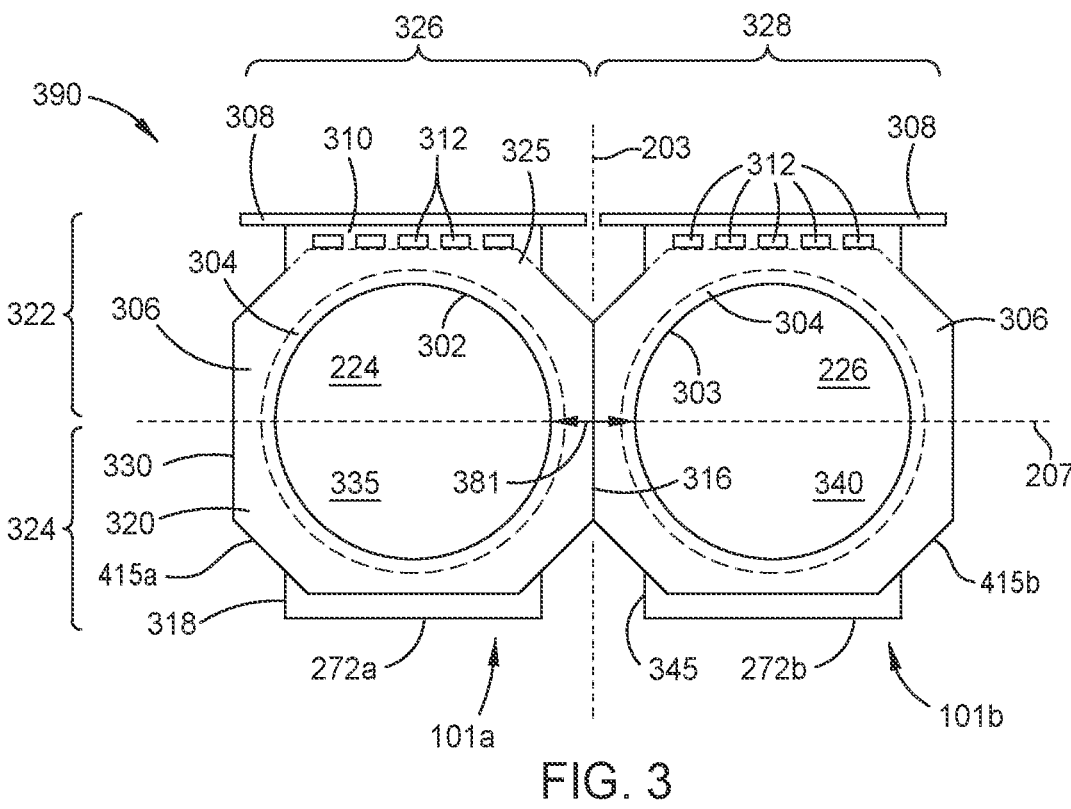
FIG. 3 is a schematic top plan view of a chamber body, which can be used as the chamber body shown in FIG. 2 according to one implementation.

FIG. 3 is a schematic top plan view of a chamber body 390, which can be used as the chamber body 230 shown in FIG. 2, according to one implementation. The chamber body 390 includes two body sections 415a, 415b, two interface surfaces 308, two inlet sections 310, an upper ring assembly 320, a lower ring assembly 318, and a first and second exhaust port 272a, 272b. The chamber body 390 encloses both the first and second processing volumes 224, 226 of the first and second chamber sides 101a, 101b.

Each of the first chamber side 201a and the second chamber side 201b (shown in FIG. 2) form a first half 326 and a second half 328 of the chamber body 390. The first half 326 of the chamber body 390 defines a first body section 415*a*. The second half 328 of the chamber body 390 defines a second body section 415*b*. The first and second halves 326, 328 of the chamber body 390 are be disposed on opposite sides of the reference plane 203. The reference plane 203 (which extends along the chamber height) bisects the chamber body 390, such that the first half 326 of the chamber body 390 is a mirror image of the second half 328 of the chamber body 390.

The upper ring assembly 320 is the upper portion of the chamber body 390. The upper ring assembly 320 at least partially encloses the first processing volume 224 and the second processing volume 226. The upper ring assembly 320 may be a continuous body with a single piece, or may be multiple components fastened together. In one or more embodiments in which the upper ring assembly 320 is a continuous body, the upper ring assembly 320 is described as a monolithic upper assembly. Utilizing a monolithic assembly for the upper ring assembly 320 facilitates ensuring that each of the first and second chamber sides 201*a*, 201*b* are disposed in the same vertical position at a given point in time. Using a monolithic upper ring assembly 320 also facilitates ensuring that the equalization port 240 brings both of the first and second processing volumes 224, 226 into fluid communication with one another without having to manage potential misalignment or broken seals between the first and second body sections 415*a*, 415*b*. The upper ring assembly 320 includes an inlet section 310, gas passages 312, a first cavity 335, a second cavity 340, a first cavity wall 302, and a second cavity wall 303. The first cavity wall 302 of the first cavity 335 is the outer wall of the first cavity 335. The second cavity wall 303 of the second cavity 340 is the outer wall of the second cavity 340.

Each of the first half 326 and the second half 328 include an interface surface 308. The interface surface 308 includes the opening 236 used to transfer the substrates 255, 259 into and out of the first and second chamber sides 201*a*, 201*b*. The interface surface 308 may be connected to another set of process chambers, a factory interface, or transfer chambers (such as the transfer chamber 108 shown in FIG. 1). The interface surface 308 is a flanged surface disposed from the first and second chamber sides 201*a*, 201*b*.

Each of the first half 326 and the second half 328 further include an inlet section 310. The inlet section 310 is a part of the upper ring assembly 320. The inlet section 310 is the section of the upper ring assembly 320 in which the gas passages 312 are formed. The inlet section 310 may be a continuous portion of the upper ring assembly 320, or may be separable from the upper ring assembly 320. The inlet section 310 extends outward from a sidewall 325 of the upper ring assembly 320. The sidewall 325 is part of an outer surface 330 of the upper ring assembly 320.

The gas passages 312 are in fluid communication with the gas panel 208 and the purge gas source 285. The gas passages 312 may be a plurality of individual gas passages 312. Each of the plurality of gas passages 312 is used to flow one or more process gases into the first and second processing volumes 224, 226 through the first and second inject passages 282*a*, 282*b*. In one or more embodiments, the gas passages 312 are formed in (e.g., through) the inlet section 310 of the first and the second body sections 415*a*, 415*b*. The gas passages 312 may include a plurality of gas passages 312, such as four or more gas passages 312, five or more gas passages 312, six or more gas passages 312, eight or more gas passages 312, 10 or more gas passages 312, or 12 or more gas passages 312 for each chamber side 201*a*, 201*b*.

A lower ring assembly 318 is disposed below the upper ring assembly 320. The lower ring assembly 318 is, for example, the lower portion of the chamber body 230 (shown in FIG. 2). The lower ring assembly 318 at least partially encloses the first processing volume 224 and the second processing volume 226. The lower ring assembly 318 may be a continuous body with a single piece, or may be multiple components fastened together. In embodiments in which the lower ring assembly 318 is a continuous body, the lower ring assembly 318 may be described as a monolithic lower ring assembly. Utilizing a monolithic lower ring assembly for the lower ring assembly 318 facilitates ensuring that each of the first and second chamber sides 101*a*, 101*b* are disposed in the same vertical position. Using a monolithic lower ring assembly 318 also facilitates ensuring that the equalization port 240 brings both of the first and second processing volumes 224, 226 into fluid communication with one another without having to manage potential misalignment or broken seals between the first and second chamber sides 201*a*, 201*b*. The lower ring assembly 318 includes the first and second exhaust ports 272*a*, 272*b*, a first cavity 335, a second cavity 340, a first cavity wall 302, and a second cavity wall 303. The first cavity wall 302 of the first cavity 335 is the outer wall of the first cavity 335. The second cavity wall 303 of the second cavity 340 is the outer wall of the second cavity 340. The equalization port 240 is disposed between each of the first and second chamber sides 201*a*, 201*b* through the lower ring assembly 318. Alternatively, the equalization port 240 is disposed through the upper ring assembly 320.

The first and second exhaust ports 272*a*, 272*b* may be disposed on the opposite side of the chamber body 230 relative to (e.g., about 180 degrees from) the first and second inject passages 282*a*, 282*b* to facilitate a cross flow regime. The first and second exhaust ports 272*a*, 272*b* may be formed in the lower ring assembly 318 and therefore are disposed vertically below the first and second gas inject passages 282*a*, 282*b*. The first exhaust ports 272*a* are disposed opposite the first inject passages 282*a* and the second exhaust ports 272*b* are disposed opposite the second inject passages 282*b*. The positioning of the first exhaust ports 272*a* allows for gas coming from the first inject passage 282*a* to flow horizontally within the first processing volume 224. The positioning of the second exhaust ports 272*b* allows for gas coming from the second inject passage 282*b* to flow horizontally within the second processing volume 226. The first and second exhaust ports 272*a*, 272*b* extend from the first and second cavity walls 302, 303 to an outer surface 345 of the lower ring assembly 318.

The support groove 304 is disposed within each of the first and second body sections 415*a*, 415*b* adjacent to the first and second cavity walls 302, 303. The support groove 304 is a lip that extends around the diameter of the first and second cavity walls 302, 303. The support groove 304 may be shaped to receive and support an edge of the first and second upper windows 216*a*, 216*b* (shown in FIG. 2). The support groove 304 may be a groove that is vertically offset from and lower than the rest of a top surface 306 of the upper ring assembly 320.

In one or more embodiments, the chamber body 390 is separated into a first side 322 and a second side 324 such that the first body section 415*a* is the first side 322 of the chamber body 390 and the second body section 415*b* is the second side 324 of the chamber body 390. The first side 322 and the second side 324 are on opposite sides of a second reference plane 207. The second reference plane 207 is a longitudinal axis of the chamber body 390. The second reference plane 207 is normal to the reference plane 203 and also extends along the chamber height. The second reference plane 207 divides the chamber body 390, such that the first side 322 of the chamber body 390 is on one side of the second reference plane 207 and the second side 324 of the chamber body 390 is on the opposite side of the second reference plane 207 relative to the first side 322. In one or more embodiments, the interface surface 308, the inlet section 310 and the gas passages 312 are all on the first side 322 while the first and second exhaust ports 272a, 272b are on the second side 324. In one or more embodiments, the interface surface 308 is on the first side and the inlet section 310, the gas passages 312, and the first and second exhaust ports 272a, 272b are split between the first and second sides 322, 324.

The first cavity 335 and the second cavity 340 are separated by a minimum distance 381. The minimum distance 381 is the minimum distance between the first cavity wall 302 and the second cavity wall 303. The minimum distance may be the minimum width of the center wall 232. The minimum distance 381 varies, such that the center wall 232 can vary in thickness. In embodiments in which the first and the second upper windows 216a, 216b are separated, the minimum distance 381 is greater than zero millimeters, such as greater than one millimeter thick. In embodiments in which the first and the second upper windows 216a, 216b are replaced with a single upper window 916 (see FIG. 9), the minimum distance 381 may be negligible, such that the minimum distance 381 is zero millimeters thick and the center wall 232 has an opening formed therethrough. In such an embodiment, the equalization port 240 may not be formed through the center wall 232. In one or more embodiments, when the minimum distance 381 is reduced to zero millimeters and the minimum width of the center wall 232 is zero millimeters, the first cavity 335 and the second cavity 340 are still separated by either a gas curtain, and/or a section of the liner 220 disposed between the first cavity 335 and the second cavity 340.

Figure 4:
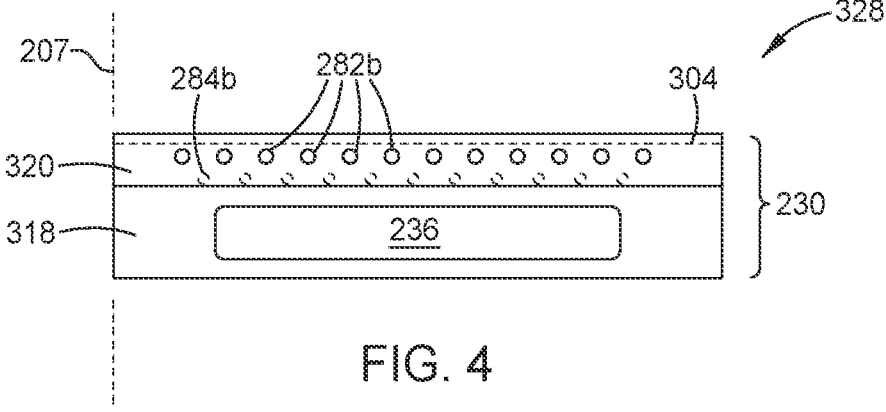
FIG. 4 is a schematic cross-sectional side view of part of the chamber body shown in FIG. 3, according to one implementation.

FIG. 4 is a schematic cross-sectional side view of part of the chamber body 390 shown in FIG. 3, according to one implementation. The part of the chamber body 390 shown in FIG. 4 is the second half 328 of the chamber body 390. The first half 326 is similar to the second half 328. The second purge gas inlet 284b, the second gas inject passages 282b, the support groove 304, and the opening 236 of the second chamber side 201b may also represent the first purge gas inlet 284a, the first gas inject 282a, the support groove 304, and the opening 236 of the first side and the first chamber side 201a. The chamber body 390 includes the upper ring assembly 320 and the lower ring assembly 318.

FIG. 4 shows the relationship between the first and second gas inject passages 282a, 282b, the first and second purge gas inlets 284a, 284b, and the opening 236. The first and second gas inject passages 282a, 282b and the first and second purge gas inlets 284a, 284b are disposed in the upper ring assembly 320. The first and second gas inject passages 282a, 282b are disposed above the first and second purge gas inlets 284a, 284b. In one or more embodiments, there may be at least 4 of each of the first and second gas inject passages 282a, 282b, such as 4-12 or more of each of the first and second gas inject passages 282a, 282b. In one or more embodiments, there may be at least 4 of each of the first and second purge gas inlets 284a, 284b, such as 4-12 or more of the first and second purge gas inlets 284a, 284b. Each of the first and second gas inject passages 282a, 282b and the first and second purge gas inlets 284a, 284b are parallel to one another. The first and second gas inject passages 282a, 282b as well as the first and second purge gas inlets 284a, 284b are spaced along the inner wall of the first and second chamber sides 201a, 201b.

The opening 236 is below the second gas inject passages 282b and the second purge gas inlets 284b. As described previously with reference to FIG. 2, the opening 236 is sized and positioned to allow substrates to pass therethrough. The opening 236 may be capable of being closed using a valve. In one or more embodiments, the opening 236 is disposed directly underneath the second gas inject passages 282b and the second purge gas inlets 284b. Alternatively, the opening 236 can be disposed adjacent to, but angularly offset from the second gas inject passages 282b and the second purge gas inlets 284b. Embodiments in which the opening 236 would be in a position alternative to that shown in FIG. 4 are described in FIGS. 5B-5D and the accompanying descriptions. The support groove 304 is above the second gas inject passages 282b and the second purge gas inlets 284b. The first and second exhaust ports 272a, 272b are disposed across from the first and second gas inject passages 282a, 282b, as shown in FIG. 5A. The first and the second exhaust ports 272a, 272b include a plurality of exhaust ports, such that there are at least two exhaust ports, such as three to five (or more) exhaust ports for each of the first and the second exhaust ports 272a, 272b.

FIG. 5A is a schematic top plan view of a chamber body 430a, which can be used as the chamber body 230 shown in FIG. 2, according to one implementation. The top plan view of the chamber body 430a illustrates the relationship between the opening 236, the first and second gas inject passages 282a, 282b and the first and second exhaust ports 272a, 272b. The chamber body 430a of FIG. 5A also includes the equalization port 240.

A gas inject chord length 404 is the chord length from a gas inject passage on one end of either the first or the second gas inject passages 282a, 282b to a gas inject passage on the opposite end of either the first or the second gas inject passages 282a, 282b. The gas inject passages used to define the gas inject chord length 404 are the gas inject passages on opposite extremes of the first and the second gas inject passages 282a, 282b. The gas inject chord length 404 as described herein is less than 500 mm, such as less than 450 mm, such as less than 400 mm. The gas inject chord length 404 is greater than 150 mm, such as greater than 200 mm, for example about 300 mm. The gas inject chord length 404 is configured to allow flow of a process gas over the entirety of front and back surfaces of substrates.

The exhaust port chord length 406 is the chord length from an outer edge of exhaust port on one end of either the first or the second exhaust ports 272a, 272b to an edge of an exhaust port on the opposite end of either the first or the second exhaust ports 272a, 272b. The exhaust ports used to define the exhaust port chord length 406 are the exhaust ports on opposite extremes of the first and the second exhaust ports 272a, 272b. The exhaust port chord length 406 is less than 500 mm, such as less than 450 mm, such as less than 400 mm. The exhaust port chord length 406 is greater than 150 mm, such as greater than 200 mm, for example about 300 mm.

The gas inject chord length 404 may be similar to the exhaust port chord length 406. In some embodiments, the gas inject chord length 404 may be less than about 10 percent smaller or larger than the exhaust port chord length 406, such as less than about 5 percent smaller or larger or less than 1 percent smaller or larger.

In the implementation of FIG. 5A, all of the first and second gas inject passages 282a, 282b, the first and second purge gas inlets 284a, 284b, and the first and second exhaust ports 272a, 272b are positioned parallel to one another. The openings 236 in the chamber body 430a are at a position such that the substrates 255, 259 move in and out of the processing volumes 224, 226 along directions that are parallel to all of the first and second gas inject passages 282a, 282b, the first and second purge gas inlets 284a, 284b, and the first and second exhaust ports 272a, 272b. The opening 236 of the first body section 415a is disposed directly below the first gas inject passages 282a. The opening 236 of the second body section 415b is disposed directly below the second gas inject passages 282b.

The equalization port 240 is disposed between the first and second body sections 415a, 415b. The equalization port 240 connects the first and second processing volumes 224, 226 to each other.

A process gas flow path 408 of process gases crosses the first processing volume 224 and travels from either the first gas inject passages 282a or the first purge gas inlets 284a (shown in FIG. 2) to the first exhaust ports 272a. The process gas flow path 408 also crosses the second processing volume 226 and travels from either the second gas inject passages 282b or the second purge gas inlets 284b (shown in FIG. 2) to the second exhaust ports 272b. Although illustrated in FIG. 5A as a curved line, the process gas flow path 408 is preferably a straight line and flows across the substrates within each of the first and second processing volumes 224, 226.

Each of first and second gas inject passages 282a, 282b and the first and second exhaust ports 272a, 272b are bisected by a first flow path plane 410a. Each of the first flow path planes 410a extends through the first body section 415a and the second body section 415b. The first flow path planes 410a are parallel to the flow of the process gases from the first and second gas inject passages 282a, 282b to the first and second exhaust ports 272a, 272b. The first flow path planes 410a are normal to the second reference plane 207 (e.g., normal to a longitudinal axis of the chamber body 430) and therefore form an angle α of 90 degrees between the first flow path plane 410a and the second reference plane 207. However, it is contemplated that the angle α may deviate from 90 degrees, such that the first flow path plane 410a and the second reference plane 207 are not normal to each other. In one or more embodiments, the angle α is about 80 degrees to about 100 degrees, such as about 85 degrees to about 95 degrees.

The implementation shown in FIG. 5A facilitates use of a shared gas panel, such as the gas panel 208, and a shared exhaust, such as the shared exhaust conduit 271 and/or the second shared exhaust conduit 228 (see FIG. 2). The use of a shared gas panel and shared exhaust facilitates reduced cost of the system, while facilitating high accuracy of heating and process gas flow within the first and second processing volumes 224, 226. The orientation of the first and second gas inject passages 282a, 282b, the first and second purge gas inlets 284a, 284b, and the first and second exhaust ports 272a, 272b facilitates space for the use of shared gas panels and shared exhaust panels.

In addition to the upper heat sources 206a, 206b and the lower heat sources 238a, 238b shown in FIG. 2, one or more side heat sources 418a, 418b, 418c, 418d (e.g., side lamps, resistive heaters, LEDS, and/or lasers, for example) are positioned outwardly of one or more of the first processing volume 224 and/or the second processing volume 226. The one or more side heat sources includes one or more first side heat sources 418a positioned outwardly of the first processing volume 224, one or more second side heat sources 418d positioned outwardly of the second processing volume 226, and one or more third side heat sources 418b, 418c positioned between the first processing volume 224 and the second processing volume 226. The side heat sources 418a, 418b, 418c, 418d are configured to heat (such as by irradiating) the first and second processing volumes 224, 226 through respective sides of the first and second processing volumes 224, 226. The third side heat sources 418b, 418c are positioned in the center wall 232. The one or more third side heat sources 418b, 418c are opposite the one or more first side heat sources 418a across the first processing volume 224. The one or more third side heat sources 418b, 418c are opposite the one or more second side heat sources 418d across the second processing volume 226.

Each of the side heat sources 418a-418d is aligned horizontally between the first plurality of gas inject passages 282a and the first purge gas inlets 284a (on a first side of the second reference plane 207), and the one or more first exhaust ports 272a (on a second side of the second reference plane 207). Each of the side heat sources 418a-418d is aligned horizontally between the second plurality of gas inject passages 282b and the second purge gas inlets 284b (on a first side of the second reference plane 207), and the one or more second exhaust ports 272b (on a second side of the second reference plane 207). The present disclosure contemplates that the side heat sources 418a-418d (or additional side heat sources used in addition to side heat sources 418a-418d) can be aligned with (e.g., positioned above) one or more of the first and second gas inject passages 282a, 282b, the first and second exhaust ports 272a, 272b, and/or the first and second purge gas inlets 284a, 284b (as shown for example in FIG. 5B).

The side heat sources 418a, 418b, 418c, 418d are arranged (e.g., vertically) in a plurality of heat source levels. Three heat source levels are shown, for example, for the side heat sources 418a, 418b, 418c, 418d in FIGS. 6 and 7. Each heat source level is arranged to independently heat (such as by independently irradiating) one level of the plurality of levels of each cassette 257, 261. The radiant beam profile of each side heat source 418a, 418b, 418c, 418d within each heat source level can be directed (e.g., oriented downwardly at an angle) toward the substrate 255 and arcuate support 263 of a respective level of each cassette 257, 261 (see for example the side heat sources 418b shown in FIGS. 14 and 19). As an example, if each cassette 257, 261 includes two levels (or three levels), then the side heat sources 418a, 418b, 418c, 418d are arranged in two heat source levels (or three heat source levels if there are three levels) to direct light rays to the respective substrates 255 and the arcuate supports 263 of the two levels of the cassettes 257, 261. Using one or more controllers (such as the controller 190), each heat source level can be independently controlled. For example, the power supply to the side heat sources of each level can be independently controlled such that the substrates supported by each level of the cassettes 257, 261 can be independently heated (e.g., to different temperatures during processing).

The side heat sources 418a-418d and heat shields (such as the one or more heat shields 2010 described in relation to FIG. 2) facilitate uniformly heating the substrates 255, 259 in batch processing operations to facilitate uniform epitaxial deposition during batch processing operations, thereby facilitating increased throughput and enhanced device performance.

The present disclosure contemplates a variety of positions for the side heat sources 418a-418d, as shown for example in FIGS. 5A-5E.

Figure 5B:
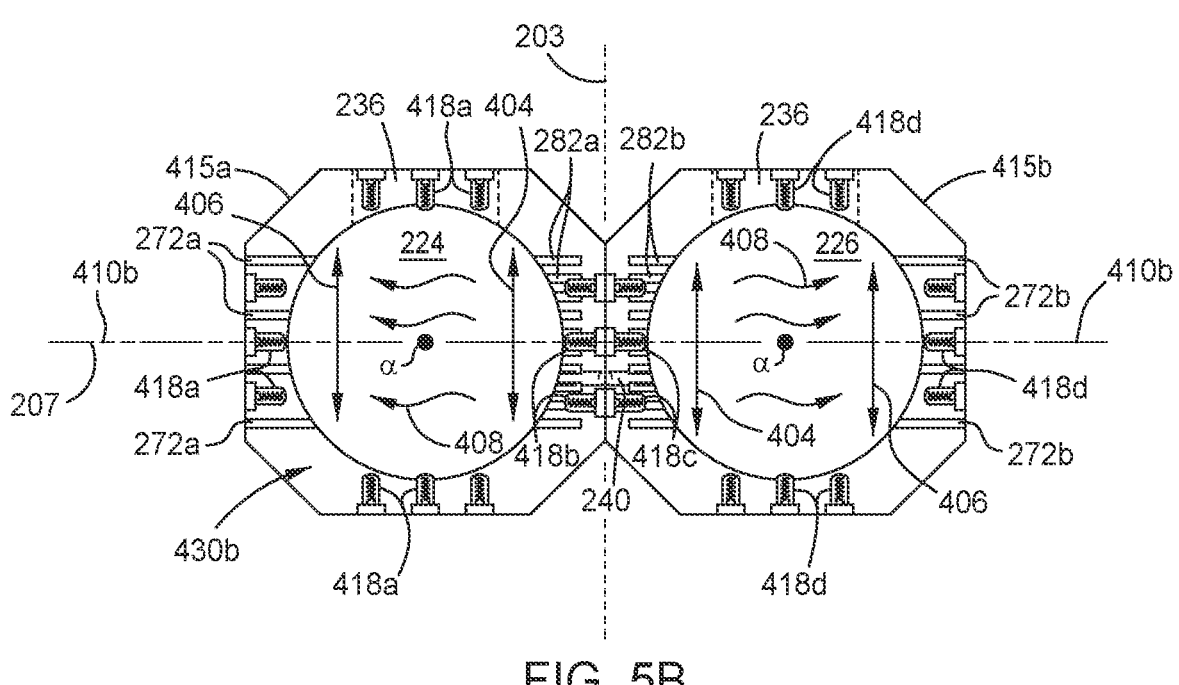
FIG. 5B is a schematic top plan view of a chamber body, which can be used as the chamber body shown in FIG. 2, according to one implementation.

FIG. 5B is a schematic top plan view of a chamber body 430b, which can be used as the chamber body 230 shown in FIG. 2, according to one implementation. In the implementation shown in FIG. 5B, the first and second gas inject passages 282a, 282b, the first and second purge gas inlets 284a, 284b, and the first and second exhaust ports 272a, 272b are positioned parallel to the second reference plane 207. The cross-sectional view of the chamber body 430b illustrates the relationship between the opening 236, the first and second gas inject passages 282a, 282b and the first and second exhaust ports 272a, 272b. The chamber body 430b shown in FIG. 5B includes the equalization port 240.

In the exemplary implementation of FIG. 5B, all of the first and second gas inject passages 282a, 282b, the first and second purge gas inlets 284a, 284b, and the first and second exhaust ports 272a, 272b are positioned parallel and in line with one another (e.g., parallel to a longitudinal axis of the chamber body 430). The openings 236 in both the first and second body sections 415a, 415b are at a position such that the substrates 255, 259 move in and out of the processing volumes 224, 226 along directions that are perpendicular to all of the first and second gas inject passages 282a, 282b, the first and second purge gas inlets 284a, 284b, and the first and second exhaust ports 272a, 272b. The opening 236 of the first chamber side 201a is aligned horizontally between the positions of the first gas inject passages 282a and the first exhaust ports 272a. The opening 236 of the second chamber side 201b is aligned between the positions of the second gas inject passages 282b and the second exhaust ports 272b.

The equalization port 240 is disposed between the first and second body sections 415a, 415b. In the implementation shown in FIG. 5B, the equalization port 240 is in line with the first and second gas inject passages 282a, 282b. The equalization port 240 is beneath the first and second gas inject passages 282a, 282b and connects the first and second processing volumes 224, 226 to each other.

The gas inject chord length 404 and the exhaust port chord length 406 of FIG. 5B are defined in the same way as the gas inject chord length 404 and the exhaust port chord length 406 of FIG. 5A. The process gas flow path 408 of FIG. 5B is also defined in the same way as the process gas flow path 408 of FIG. 5A. In the implementation shown in FIG. 5B, the process gas flow paths 408 are diverging from the center wall 232 of the chamber body 430 and moving towards the outer edges of the chamber body 430. The process gas flowing from the first gas inject passage 282a flows towards the first exhaust port 272a and the process gas flowing from the second gas inject passage 282b flows towards the second exhaust port 272b.

As in FIG. 5A, both the first and second gas inject passages 282a, 282b and the first and second exhaust ports 272a, 272b are bisected by a second flow path plane 410b. The second flow path planes 410b extend through the first body section 415a and the second body section 415b, and extend along the height of the chamber. In the implementation shown in FIG. 5B, the second flow path planes 410b are co-planar or form a single plane through the chamber body 430. The second flow path plane 410b is parallel to the flow of the process gases from the first and second gas inject passages 282a, 282b to the first and second exhaust ports 272a, 272b. In the implementation shown in FIG. 5B, the second flow path plane 410b is parallel to the second reference plane 207. The second flow path plane 410b and the second reference plane 207 form an angle α. In the implementation shown in FIG. 56, the angle α is about 0 degrees. In one or more embodiments, the angle α deviates from 0 degrees and is about −10 degrees to about 10 degrees, such as about −5 degrees to about 5 degrees.

The implementation shown in FIG. 5B facilitates use of a shared gas panel, such as the gas panel 208, and a shared exhaust, such as the shared exhaust conduit 271 and/or the second shared exhaust conduit 228.

Figure 5C:
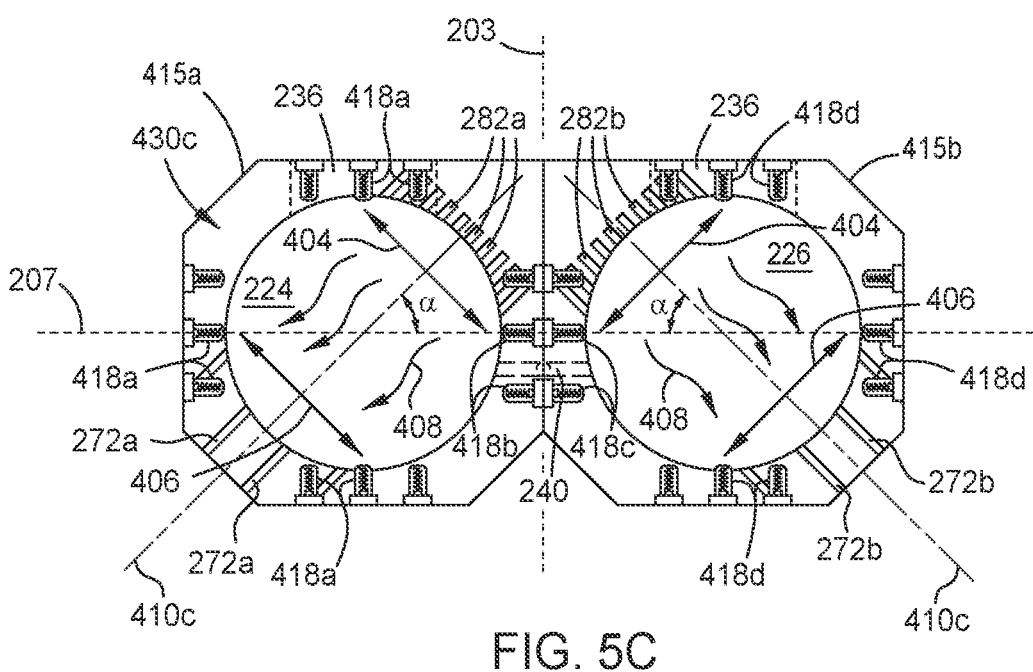
FIG. 5C is a schematic top plan view of a chamber body, which can be used as the chamber body shown in FIG. 2, according to one implementation.

FIG. 5C is a schematic top plan view of a chamber body 430c, which can be used as the chamber body 230 shown in FIG. 2, according to one implementation. In the implementation shown in FIG. 5C the chamber body 230 of FIG. 2 is replaced with the chamber body 430c of FIG. 4C. In the chamber body 430c, the first and second gas inject passages 282a, 282b, the first and second purge gas inlets 284a, 284b, and the first and second exhaust ports 272a, 272b are positioned at an acute angle α to the second reference plane 207 (e.g., the longitudinal axis of chamber body 430). The cross-sectional view of the chamber body 430c illustrates the relationship between the opening 236, the first and second gas inject passages 282a, 282b and the first and second exhaust ports 272a, 272b. The chamber body 430c shown FIG. 5C also includes the equalization port 240, and the plurality of side heat sources 418a-418d are included.

In the implementation shown in FIG. 5C, all of the first gas inject passages 282a, the first purge gas inlets 284a, and the first exhaust ports 272a are positioned parallel and in line with one another along a third flow path plane 410c. The second gas inject passages 282b, the second purge gas inlets 284b, and the second exhaust ports 272b are also positioned parallel and in line with one another along another third flow path plane 410c. The openings 236 in both the first and second body sections 415a, 415b are at an angle with all of the first and second gas inject passages 282a, 282b, the first and second purge gas inlets 284a, 284b, and the first and second exhaust ports 272a, 272b. The opening 236 of the first body section 415a is adjacent to and disposed partially below the first gas inject passages 282a and the first purge gas inlets 284a. The opening 236 of the second body section 415b is adjacent to and disposed partially below the second gas inject passages 282b and the second exhaust ports 272b. The opening 236 is partially disposed below the second gas inject passages 282b and the second purge gas inlets 284b.

The equalization port 240 is disposed between the first and second body sections 415a, 415b. In the implementation shown in FIG. 5C, the equalization port 240 connects the first and second processing volumes 224, 226 to each other.

The gas inject chord length 404 and the exhaust port chord length 406 of FIG. 5C are defined in the same way as the gas inject chord length 404 and the exhaust port chord length 406 of FIG. 5A and FIG. 5B. The process gas flow path 408 of FIG. 5C is also defined in the same way as the process gas flow path 408 of FIG. 5A and FIG. 5B. In the implementation shown in FIG. 5C, the process gas flow paths 408 travel at an angle to the reference plane 203 and the second reference plane 207 of the chamber body 430c and moving towards the outer edges of the chamber body 430c. The process gas flowing from the first gas inject passage 282a flows towards the first exhaust port 272a and the process gas flowing from the second gas inject passage 282b flows towards the second exhaust port 272b.

As in FIGS. 5A and 5B, the first and second gas inject passages 282a, 282b and the first and second exhaust ports 272a, 272b are bisected by third flow path planes 410c. The third flow path planes 410c extend through the first body section 415a and the second body section 415b. Each of the third flow path planes 410c are parallel to the flow of the process gases from one of the first or the second gas inject passages 282a, 282b to one of the first or the second exhaust ports 272a, 272b. In the implementation shown in FIG. 5C, each of third flow path planes 410c are at an acute angle α with the second reference plane 207 when the angle α is facing (e.g., oriented) inward towards the reference plane 203. The angle α is the angle on the inside of the third flow path planes 410c and closer to the opening 236. In the implementation shown in FIG. 5C and the accompanying text, the angle α is about 45 degrees. In one or more embodiments, the angle α is about 10 degrees to about 80 degrees, such as about 20 degrees to about 70 degrees, such as about 30 degrees to about 60 degrees, such as about 35 degrees to about 55 degrees, such as about 40 degrees to about 50 degrees.

In the implementation shown in FIG. 5C, a shared gas panel, such as the gas panel 208 may be more easily used to provide process gas to the first and second chamber sides 201a, 201b. The first and second gas inject passages 282a, 282b are close to one another and therefore shorter gas conduits can be utilized to transfer the process gasses from the gas panel 208 to the first and second gas inject passages 282a, 282b. Having shorter gas conduits saves on cost and the pressure may be more equally distributed (allowing improved gas flow uniformity) between the first and second chamber sides 201a, 201b without variable conduit lengths and back pressures. A shared exhaust (such as the shared exhaust conduit 271) may be used to exhaust the process gases. The shared gas panel and shared exhaust facilitates reducing the difficulty of servicing the heat source head and other chamber components. The present disclosure contemplates that separate exhaust systems may be used for the processing volumes 224, 226.

Figure 5D:
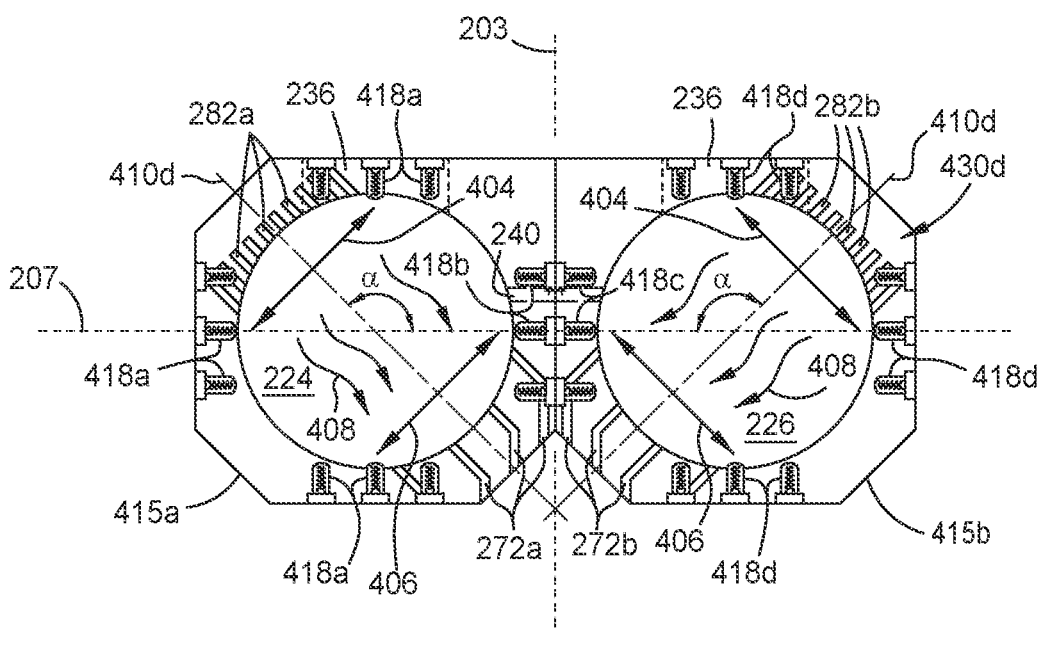
FIG. 5D is a schematic top plan view of a chamber body, which can be used as the chamber body shown in FIG. 2, according to one implementation.
Figure 5E:
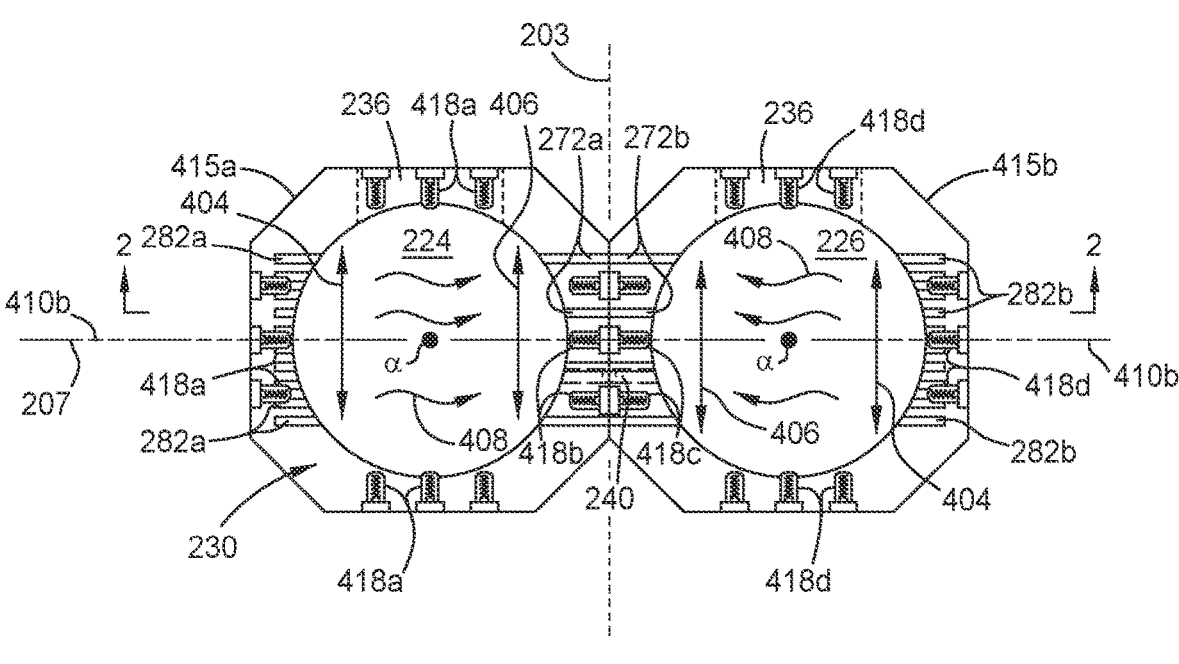
FIG. 5E is a schematic top plan view of the chamber body shown in FIG. 2, according to one implementation.

FIG. 5D is a schematic top plan view of a chamber body 430d, which can be used as the chamber body 230 shown in FIG. 2, according to one implementation. In the chamber body 430d, the first and second gas inject passages 282a, 282b, the first and second purge gas inlets 284a, 284b, and the first and second exhaust ports 272a, 272b are positioned at an obtuse angle α to the second reference plane 207 (e.g., obtuse to a longitudinal axis of the chamber body 430). The top plan view of the chamber body 430d illustrates the relationship between the opening 236, the first and second gas inject passages 282a, 282b and the first and second exhaust ports 272a, 272b. The chamber body 430d shown in FIG. 5D includes the equalization port 240.

In the implementation shown in FIG. 5D, all of the first gas inject passages 282a, the first purge gas inlets 284a, and the first exhaust ports 272a are positioned parallel and in line with one another along a fourth flow path plane 410d. The second gas inject passages 282b, the second purge gas inlets 284b, and the second exhaust ports 272b are also positioned parallel and in line with one another along another fourth flow path plane 410d. The openings 236 in both the first and second body sections 415a, 415b are at an angle with all of the first and second gas inject passages 282a, 282b, the first and second purge gas inlets 284a, 284b, and the first and second exhaust ports 272a, 272b. The opening 236 of the first chamber side 101a is adjacent to and disposed partially below the first gas inject passages 282a and the first exhaust ports 272a. The opening 236 is partially disposed below the first gas inject passages 282a and the first purge gas inlets 284a. The opening 236 of the second chamber side 201b is adjacent to and disposed partially below the second gas inject passages 282b and the second exhaust ports 272b. The opening 236 is partially disposed below the second gas inject passages 282b and the second purge gas inlets 284b.

The equalization port 240 is disposed between the first and second body sections 415a, 415b. In the implementation shown in FIG. 5D, the equalization port 240 connects the first and second processing volumes 224, 226 to each other.

The gas inject chord length 404 and the exhaust port chord length 406 of FIG. 5D are defined in the same way as the gas inject chord length 404 and the exhaust port chord length 406 of FIGS. 5A-5C. The process gas flow path 408 of FIG. 5D is also defined in the same way as the process gas flow path 408 of FIGS. 5A-5C. In the implementation shown in FIG. 5D, the process gas flow paths 408 travel at an angle α to the reference plane 203 and the second reference plane 207 of the chamber body 430d and moving towards the center wall 232 of the chamber body 430d. The process gas flowing from the first gas inject passage 282a flows towards the first exhaust port 272a and the process gas flowing from the second gas inject passage 282b flows towards the second exhaust port 272b.

As in FIGS. 5A-5C, each of the first and second gas inject passages 282a, 282b and the first and second exhaust ports 272a, 272b are bisected by fourth flow path planes 410d. The fourth flow path planes 410d extend through each of the first body section 415a and the second body section 415b. The fourth flow path planes 410d are parallel to the flow of the process gases from the first and second gas inject passages 282a, 282b to the first and second exhaust ports 272a, 272b. In the implementation shown in FIG. 5D, the fourth flow path planes 410d are disposed at an obtuse angle α with the second reference plane 207, when the angle is taken as an inside angle towards the reference plane 203. The angle α is the angle on the inside of the second flow path plane 410b and closer to the opening 236. In the implementation shown in FIG. 5D, the angle α is about 135 degrees. In one or more embodiments, the angle α is about 100 degrees to about 170 degrees, such as about 110 degrees to about 160 degrees, such as about 120 degrees to about 150 degrees, such as about 125 degrees to about 145 degrees, such as about 130 degrees to about 140 degrees.

In the implementation shown in FIG. 5D, a shared exhaust conduit 271 may be more easily used to remove process gas from the first and second chamber sides 201a, 201b. The first and second exhaust ports 272a, 272b are close to one another and therefore shorter gas conduits are utilized to transfer the exhaust gasses from the first and second processing volumes 224, 226 to the vacuum pump 210. In implementations in which the chamber body 430d is a monolithic body, the first and second exhaust ports 272a, 272b may merge into a single exhaust. Having short gas conduits and a single exhaust reduces chamber costs. The use of a single vacuum pump 210 further saves on equipment cost. The use of a shared exhaust conduit 271 simplifies the maintenance of the exhaust, which reducing the total downtime of the processing chambers when cleaning the exhaust systems.

In the implementation shown in FIGS. 5C and 5D, the side heat sources 418a-418d are at least partially offset horizontally from the first and second gas inject passages 282a, 282b, the first and second purge gas inlets 284a, 284b, and the first and second exhaust ports 272a, 272b.

FIG. 5E is a schematic top plan view of the chamber body 230 shown in FIG. 2, according to one implementation. The chamber body 230 is similar to the chamber body 430b shown in FIG. 5B, and includes one or more of the aspects, features, components, operations, and/or properties thereof.

In the implementation shown in FIG. 5E, the side of the first gas inject passages 282a and the first purge gas inlets 284a are swapped with the side of the first exhaust ports 272a, relative to what is shown in FIG. 5B. In the implementation shown in FIG. 5E, the side of the second gas inject passages 282*b* and the second purge gas inlets 284*b* are swapped with the side of the second exhaust ports 272*b*, relative to what is shown in FIG. 5B.

FIG. 6 is a schematic cross-sectional side view of a processing apparatus 600 according to one implementation. The cross-sectional view shown in FIG. 6 is taken along Section 6-6 shown in FIG. 5A. The apparatus 600 is similar to the processing apparatus 200 shown in FIG. 2, and includes one or more of the aspects, features, components, operations, and/or properties thereof.

The present disclosure contemplates that the liners 220 may each include a transparent window (or be at least partially replaced with a transparent window) that allows the radiant energy from the side heat sources 418*a*-418*d* to pass therethrough and reach one or more heat shields (such as the one or more heat shields 2010 described in relation to FIG. 2) and/or the first and second substrates 255, 259.

Each of the side heat sources 418*a*-418*d* is positioned at a height (such as the height H1 shown in FIG. 6) aligned vertically between the one or more first upper heat sources 206*a* and the one or more first lower heat sources 238*a*. Each of the side heat sources 418*a*-418*d* is positioned at the height aligned vertically between the one or more second upper heat sources 206*b* and the one or more second lower heat sources 238*b*. In one or more embodiments, the height is relative to the bottom 234.

The present disclosure contemplates that one or more of the side heat sources 418*a*, 418*b*, 418*c*, 418*d* can be disposed in a respective annular ring that at least partially surrounds each of the first cassette 257 and the second cassette 261. Each annular ring can completely or partially surround the respective cassette 257, 261. In implementations where heat shields are used in the respective processing volumes 224, 226, the annular ring can be disposed to completely or partially surround the respective heat shields.

One or more side sensors 281 (such as one or more pyrometers) can be used to measure temperatures within the first and second processing volumes 224, 226 from respective sides of the first and second processing volumes 224, 226. The side sensors 281. The side sensors 281 are arranged in a plurality of sensor levels (two sensor levels are shown in FIG. 6). In one or more embodiments, the number of sensor levels is equal to the number of levels of the cassettes 257, 261. Each sensor level corresponds to a respective level of the cassettes 257, 261 such that one or more side sensors 281 of each sensor level is configured to measure a temperature of the respective level (e.g., a temperature of the substrate and/or the support of the respective level). Each side sensor 281 can be directed (e.g., oriented downwardly at an angle) toward the substrate 255 and arcuate support 263 of a respective level of each cassette 257, 261 (see for example the side sensors 281 shown in FIGS. 14 and 19).

Figure 7:
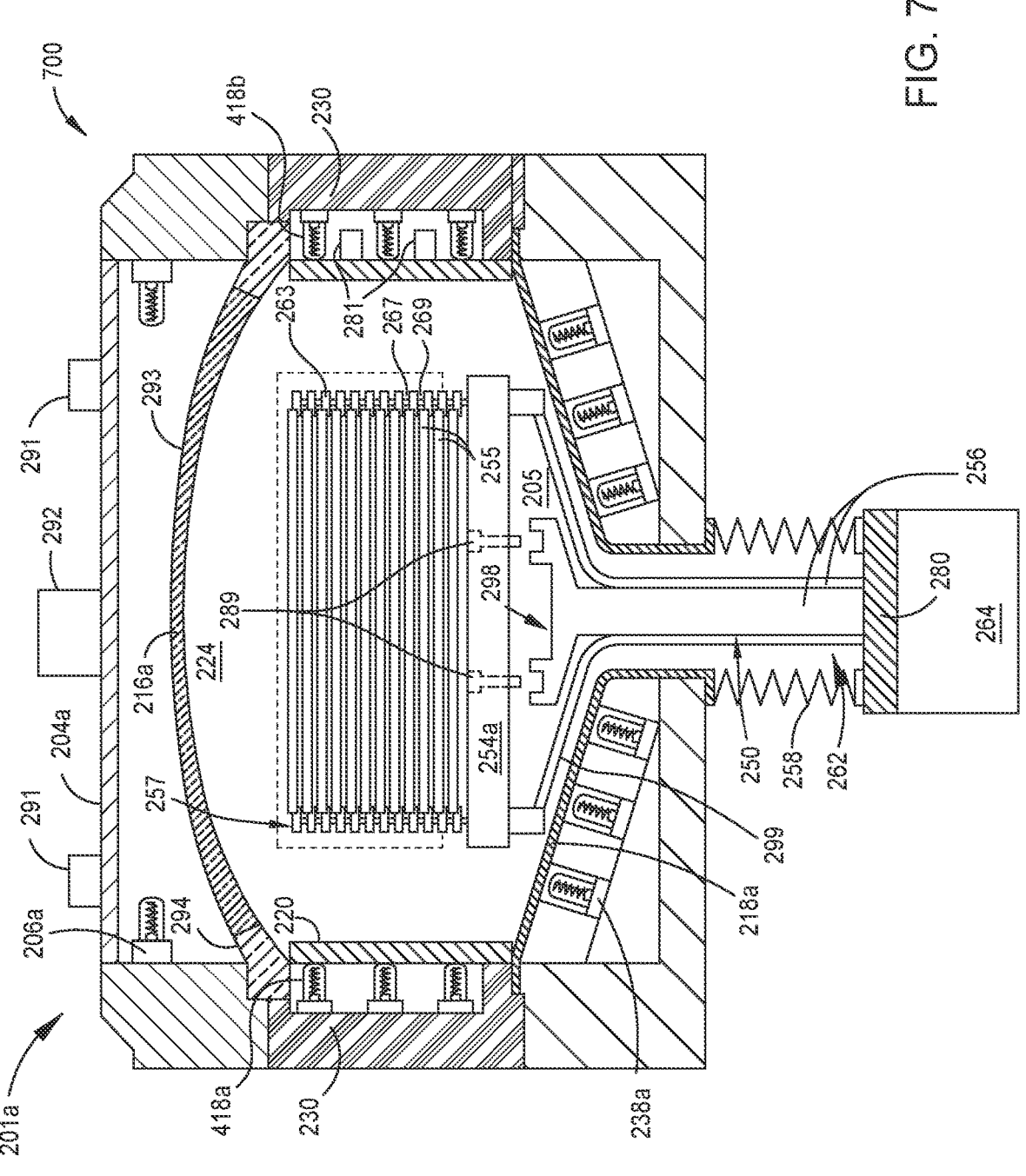
FIG. 7 is a schematic cross-sectional side view of a processing apparatus according to one implementation.

FIG. 7 is a schematic cross-sectional side view of a processing apparatus 700 according to one implementation. The apparatus 700 is similar to the apparatus 600 shown in FIG. 6, and includes one or more of the aspects, features, components, operations, and/or properties thereof.

In the implementation shown in FIG. 7, the second chamber side 101*b* is omitted. The center wall 232 can be identical to the chamber body 230. The wall 232 (a sidewall in FIG. 7) can be integrated with the chamber body 230 as a single sidewall. The present disclosure contemplates that one or more heat shields 2010 can be disposed in the first processing volume 224. FIG. 8 illustrates operations of a method 800 for batch processing a plurality of substrates, according to one implementation. The method 800 uses a shared gas panel, one or more shared exhaust conduits, and/or a shared exhaust plenum. The method 800 can use any of the apparatus, aspects, features, components, properties, and/or operations described in relation to one or more of FIGS. 1-7.

Operation 801 includes simultaneously loading a first substrate onto a first cassette positioned in the first processing volume and a second substrate onto a second cassette positioned in a second processing volume. The first substrate is one of a plurality of first substrates supported by the first cassette and the second substrate is one of a plurality of second substrates supported by the second cassette. The two cassettes are simultaneously loaded with substrates by a transfer robot (such as the transfer robot 110 shown in FIG. 1) to save on transfer time and increase overall throughput. That is, operations of powered and actuated components such as motors, slit valves, heat sources, and pressure and flow controllers before, during, and after substrates transit through openings 236 of the two processing volumes occur simultaneously (e.g., within a few seconds) between the two chamber sides having the two processing volumes 224, 226.

Operation 802 includes simultaneously moving the first pedestal assembly and the second pedestal assembly to raise and continuously rotate the first cassette relative to the first plurality of gas inject passages and raise and continuously rotate the second cassette relative to the second plurality of gas inject passages. In one or more embodiments, the first and second pedestal assemblies continue to rotate during operations 803, 804, and 806.

Operation 803 of the method includes simultaneously supplying one or more process gases to the first processing volume and the second processing volume of a dual-chamber body at substantially the same flow rate, substantially the same gas temperature, and substantially the same pressure. The term "substantially" includes a difference of 5% or less in relation to the method 800. The first processing volume includes the first cassette (on a first pedestal assembly) supporting the plurality of first substrates disposed therein, and the second processing volume includes the second cassette (on a second pedestal assembly) supporting the plurality of second substrates disposed therein.

The one or more process gases flow from a shared gas panel. The one or more process gases may be any suitable process gas used in an epitaxial deposition process. The process gas may include group IV precursor gases, group V precursor gases, and/or group III precursor gases. In one or more embodiments, a mixture of different process gases may be utilized for operation 803. In one or more embodiments, the process gas may include, for example, a silicon-containing precursor such as silanes, halogenated silanes, and/or any combination thereof. Silanes may include silane ($SiH_4$) and higher silanes with the empirical formula $Si_xH_{(2x+2)}$, such as disilane ($Si_2H_6$), trisilane ($Si_3H_8$), and tetrasilane ($Si_4H_{10}$). Halogenated silanes may include monochlorosilane (MCS), dichlorosilane (DCS), trichlorosilane (TCS), hexachlorodisilane (HCDS), octachlorotrisilane (OCTS), silicon tetrachloride (STC), and/or any combination thereof. The one or more process gases may include a germanium-containing precursor. The one or more process gases may include a precursor gas. The precursor gas may include, for example, phosphorous, boron, arsenic, gallium, and/or aluminum, depending upon the desired conductive characteristic of the deposited epitaxial layer. The one or more process gases may include an etchant gas. The etchant gas may include, for example any gas containing halogen molecules such as hydrogen chloride (HCl), chlorine (Cl), and/or hydrogen fluoride (HF). The one or more process gases may include a carrier gas. The carrier gas may include, for example, nitrogen ($N_2$), argon (Ar), helium (He), and/or hydrogen ($H_2$).

The one or more process gases flown from the gas panel 208 can be divided, for example, using a multi-channel flow controller. The one or more process gases are then flown through the first and second gas inject passages 282a, 282b to enter the first and second processing volumes 224, 226. The split process gas(es) are flown at substantially the same flow rate through both of the first and second gas inject passages 282a, 282b. There may be additional apparatus elements (not shown) along the process gas flow path, such as flow controllers, valves, and/or pumps. The additional apparatus elements may be disposed between the gas panel 208 and the first and second gas inject passages 282a, 282b. The additional flow control elements may facilitate equal distribution of the process gas flow between the first and second processing volumes 224, 226.

Operation 804 of the method 800 includes simultaneously heating the first processing volume and the second processing volume to substantially the same volume temperature. The heating can include simultaneously heating the first substrates and the second substrates to substantially the same substrate temperature.

Operation 806 of the method 800 includes flowing the one or more process gases over a front surface and a back surface of each one of the first substrates in the first processing volume and each one of the second substrates in the second processing volume. The one or more process gases may be delivered over the substrates from the first and second gas inject passages 282a, 282b. The flow of the one or more process gases over the front and back surfaces of the substrates facilitates an epitaxial deposition process that deposits film on both the front surfaces and the back surfaces of the substrates. The present disclosure contemplates that the one or more process gases can flow over one of the front surfaces or the back surfaces of the substrates (such as the front surfaces) for single-sided deposition.

Operation 808 of the method 800 includes evacuating the one or more process gases from the first processing volume and the second processing volume through a shared exhaust. The shared exhaust can include a shared exhaust plenum. The shared exhaust plenum can include the shared exhaust conduit 271 and/or the second shared exhaust conduit 228 discussed herein. The process gas is evacuated through the first and the second exhaust ports 272a, 272b from the first and second processing volumes 224, 226 before entering the shared exhaust conduit 271. After the one or more process gases enter the shared exhaust conduit 271, the one or more process gases are removed by the pump 210 through the shared exhaust conduit 228.

Figure 9:
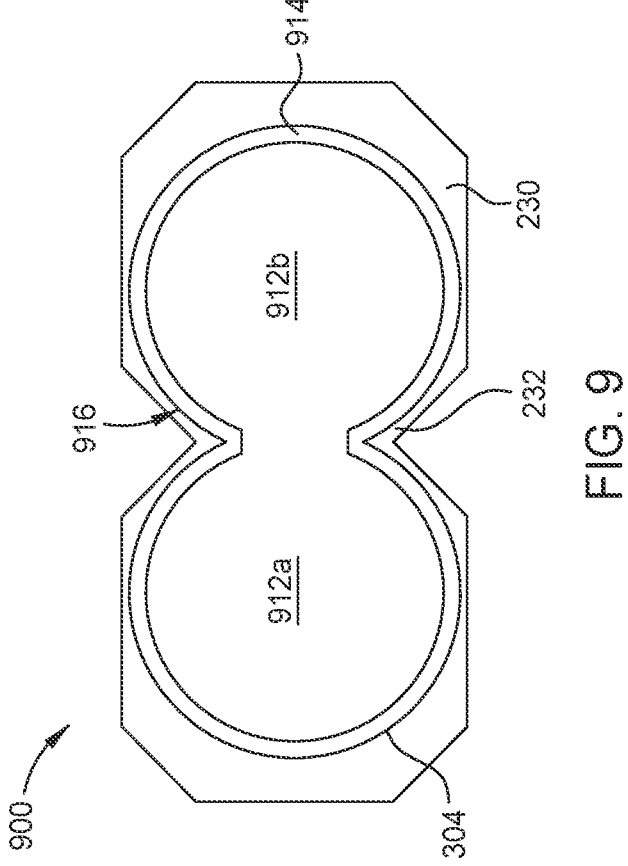
FIG. 9 is a schematic top plan view of a single upper window assembly disposed above the chamber body of both the first chamber side and the second chamber side of FIG. 2, according to one implementation.

Operation 810 of the method 800 includes simultaneously moving the first pedestal assembly and the second pedestal assembly to orient the first cassette and second cassette relative to the openings 236. Once oriented, the first and second pedestal assemblies are simultaneously lowered to engage lift pins with the first substrates and second substrates such that the first substrates and the second substrates can be removed from the first and second processing volumes (through the openings 236). FIG. 9 is a schematic top plan view of a single upper window assembly 900 disposed above the chamber body 230 of both the first chamber side 201a and the second chamber side 201b of FIG. 2, according to one implementation. The single upper window assembly 900 includes a single upper window 916 and the chamber body 230. The single upper window 916 includes a two inner windows 912a, 912b. The two inner windows 912a, 912b are a first inner window 912a disposed over the first processing volume 224 shown in FIG. 2, and a second inner window 912b disposed over the second processing volume 226 shown in FIG. 2. Outer window supports 914 are disposed around the first and the second inner windows 912a, 912b and support the single upper window assembly 900 along a support groove, similar to the support groove 304.

In implementations in which the single upper window assembly 900 is used, a portion of the single upper window 916 is disposed over the middle of the center wall 232. The support groove 304 of the single upper window 916 is shaped similarly to two overlapping ovals or circles, such that the single upper window 916 has an outer profile similar to that of an infinity symbol, the number 8, or a lemniscate. The upper window assembly 900 may be utilized with embodiments shown in FIGS. 2-4 as well as FIGS. 5A-5E.

Although describing two processing chamber sides with shared gas panels and exhaust systems, implementations disclosed herein may additionally be scaled to include additional processing chamber sides. In one or more embodiments, there may be three or four processing chamber sides disposed adjacent one another and having a shared chamber body, such as the chamber body 230. As shown in FIG. 6, a single processing volume may be used.

Figure 10:
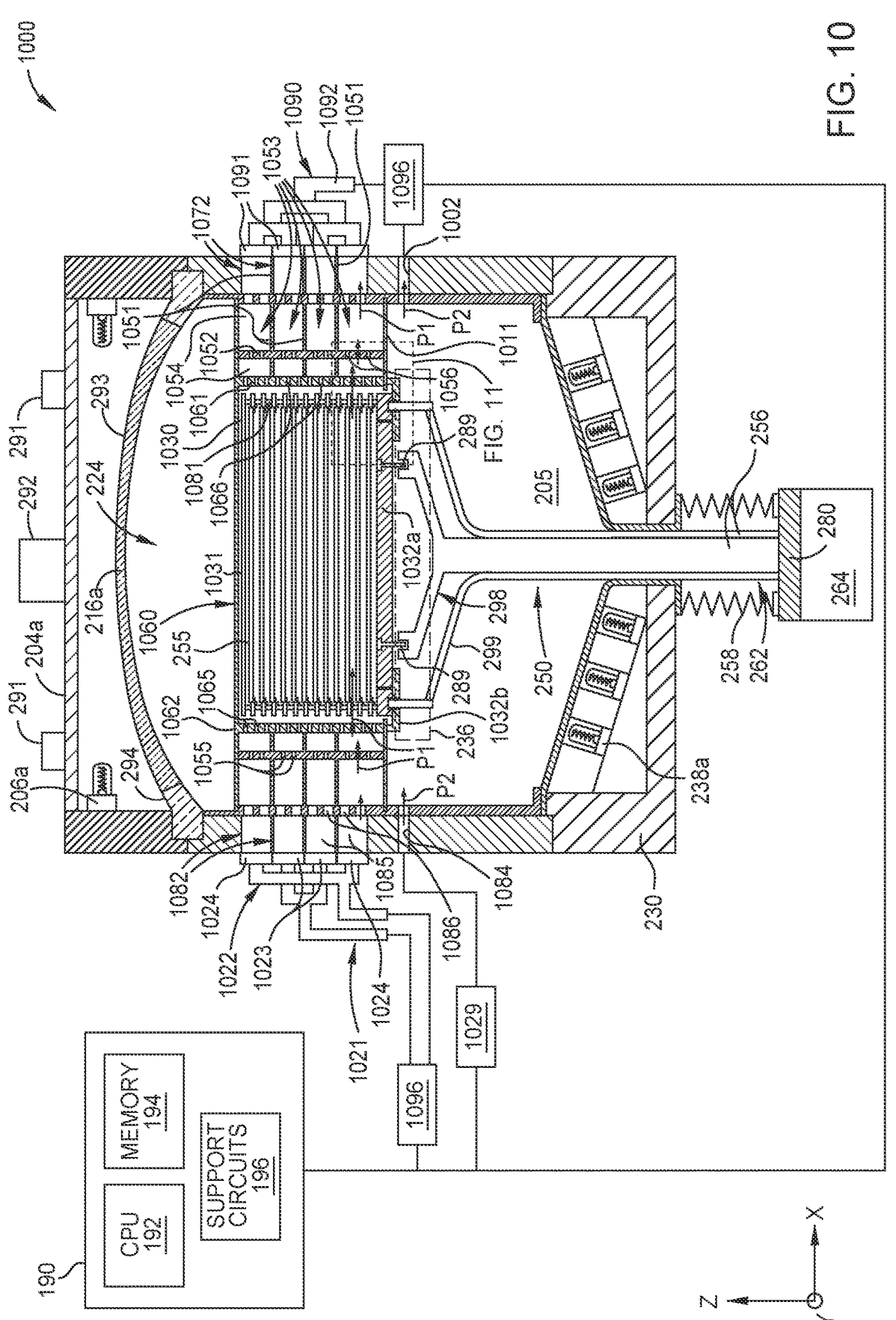
FIG. 10 is a schematic cross-sectional side view of a processing apparatus, according to one implementation.

FIG. 10 is a schematic cross-sectional side view of a processing apparatus 1000, according to one implementation. The processing apparatus 1000 is similar to the processing apparatus 700 shown in FIG. 7, and includes one or more of the aspects, features, components, operations, and/or properties thereof.

The apparatus 1000 includes a plurality of gas inject passages 1082 formed in the chamber body 230 and in fluid communication with the processing volume 224, and one or more gas exhaust passages 1072 (a plurality is shown in FIG. 10) formed in the chamber body 230 opposite the plurality of gas inject passages 1082. The one or more gas exhaust passages 1072 are in fluid communication with the processing volume 224. Each of the plurality of gas inject passages 1082 and one or more gas exhaust passages 1072 are formed through one or more sidewalls of the chamber body 230 and through one or more liners 1020 that line the one or more sidewalls of the chamber body 230.

Each gas inject passage 1082 includes a gas channel 1085 formed in the chamber body 230 and one or more gas openings 1086 (two and three are shown in FIG. 10) formed in the one or more liners 1020. One or more supply conduit systems are in fluid communication with the gas inject passages 1082. In FIG. 10, an inner supply conduit system 1021 and an outer supply conduit system 1022 are in fluid communication with the gas inject passages 1082. The inner supply conduit system 1021 includes a plurality of inner gas boxes 1023 mounted to the chamber body 230 and in fluid communication with an inner set of the gas inject passages 1082. The outer supply conduit system 1022 includes a plurality of outer gas boxes 1024 mounted to the chamber body 230 and in fluid communication with an outer set of the gas inject passages 1082.

The processing apparatus 1000 includes a flow guide structure 1050 positioned in the processing volume 224. The flow guide structure 1050 includes one or more first flow dividers 1051 (three are shown in FIG. 10) that divide the processing volume into a plurality of flow levels 1053 (four flow levels are shown in FIG. 1). The flow guide structure 1050 includes one or more second flow dividers 1052 oriented to intersect the one or more first flow dividers 1051 and divide each flow level 1053 of the plurality of flow levels 1053 into a plurality of flow sections 1054 (two flow sections 1054 are shown for each flow level 1053 in FIG. 10). In the implementation shown in FIG. 10, the first flow dividers 1051 each include a ring, and the one or more second flow dividers 1052 each include a cylindrical sleeve that surrounds an innermost flow section 1054 of the flow sections 1054. The one or more first flow dividers 1051 are coupled to the one or more liners 1020.

The plurality of gas inject passages are 1082 positioned as a plurality of inject levels such that each gas inject passage 1082 corresponds to one of the plurality of inject levels. Each inject level aligns with a respective flow level 1053. The gas inject passages 1082 of each inject level are open to an outermost flow section 1054 of the respective flow level. In the implementation shown in FIG. 10, two or three of the gas openings 1086 are grouped into each flow level, and the gas openings 1086 are open to the outermost flow section 1054 of the respective flow level.

The apparatus 1000 includes a heat shield structure 1060 positioned in the processing volume 224. The heat shield structure 1060 includes a first shield plate 1061 positioned inwardly of the one or more second flow dividers 1052, and a second shield plate 1062. The second shield plate 1062 is oriented to intersect the first shield plate 1061 and is supported at least partially by the one or more liners 1020. The first shield plate 1061 can be a cylindrical sleeve.

Each of the one or more second flow dividers 1052 includes a plurality of divider inlet openings 1055 and a plurality of divider outlet openings 1056 formed therein. The divider outlet openings 1056 are opposite of the divider inlet openings 1055. As shown in FIG. 10, two or three of the divider inlet openings 1055 and two or three of the divider outlet openings 1056 are grouped into a respective flow level 1053 of the flow levels 1053.

The first shield plate 1061 includes a plurality of shield inlet openings 1065 and a plurality of shield outlet openings 1066 formed therein. The shield outlet openings 1066 are opposite of the shield inlet openings 1065. The plurality of divider inlet openings 1055 are offset from the plurality of shield inlet openings 1065 in the X-Y plane.

Each of the one or more liners 1020, the one or more first flow dividers 1051, the one or more second flow dividers 1052, the first shield plate 1061, and the second shield plate 1062 is formed of one or more of quartz, silicon carbide (SiC), or graphite coated with SiC.

The apparatus 1000 includes a cassette 1030 positioned in the processing volume 224 and at least partially supported by the pedestal assembly 250. The cassette 1030 is positioned inwardly of the first shield plate 1061. A pre-heat ring 1011 is positioned outwardly of the cassette 1030. The pre-heat ring 1011 is coupled to and/or at least partially supported by the one or more liners 1020. The one or more second flow dividers 1052 are coupled to and/or at least partially supported by the pre-heat ring 1011. The cassette 1030 includes a first cassette plate 1032, and a second cassette plate 1031 spaced from the first cassette plate 1032.

During operations (such as during an epitaxial deposition operation), one or more process gases P1 are supplied to the processing volume 224 through the inner supply conduit system 1021 and the outer supply conduit system 1022, and through the plurality of gas inject passages 1082. The one or more process gases P1 are supplied from one or more gas sources 1096 in fluid communication with the plurality of gas inject passages 1082. The flow(s) of the one or more process gases P1 are divided into the plurality of flow levels 1053. The division of process gas(es) into the plurality of flow levels 1053 facilitates uniform processing (e.g., deposition) onto the substrates, center-to-edge uniformity, and process adjustability.

The processing apparatus 1000 includes an exhaust conduit system 1090. The one or more process gases P1 can be exhausted through exhaust gas openings formed in the one or more liners 1020, exhaust gas channels formed in the chamber body 230, and then through exhaust gas boxes 1091. The one or more process gases P1 can flow from exhaust gas boxes 1091 and to an optional common exhaust box 1092, and then out through a conduit using one or more pump devices 1097 (such as one or more vacuum pumps).

Purge gas P2 supplied from a purge gas source 1029 is introduced to the bottom region 205 of the processing volume 224 through one or more purge gas inlets 1084 formed in the one or more sidewalls of the chamber body 230.

The one or more purge gas inlets 1084 are disposed at an elevation below the gas inject passages 1082. If the one or more liners 1020 are used, a section of the one or more liners 1020 may be disposed between the gas inject passages 1082 and the one or more purge gas inlets 1084. In either case, the one or more purge gas inlets 1084 are configured to direct the purge gas P2 in a generally radially inward direction. The one or more purge gas inlets 1084 may be configured to direct the purge gas P2 in an upward direction. During a film formation process, the pedestal assembly 250 is located at a position that can facilitate the purge gas P2 to flow generally along a flow path across a back side of the first cassette plate 1032. The purge gas P2 exits the bottom region 105 and is exhausted out of the processing apparatus 1000 through one or more purge gas exhaust passages 1002 located on the opposite side of the processing volume 224 relative to the one or more purge gas inlets 1084.

Although not shown in FIG. 10 for visual clarity purposes, the present disclosure contemplates that the processing apparatus 1000 can include one or more side heat sources (such as the one or more side heat sources 418a, 418b shown in FIG. 7).

Figure 11:
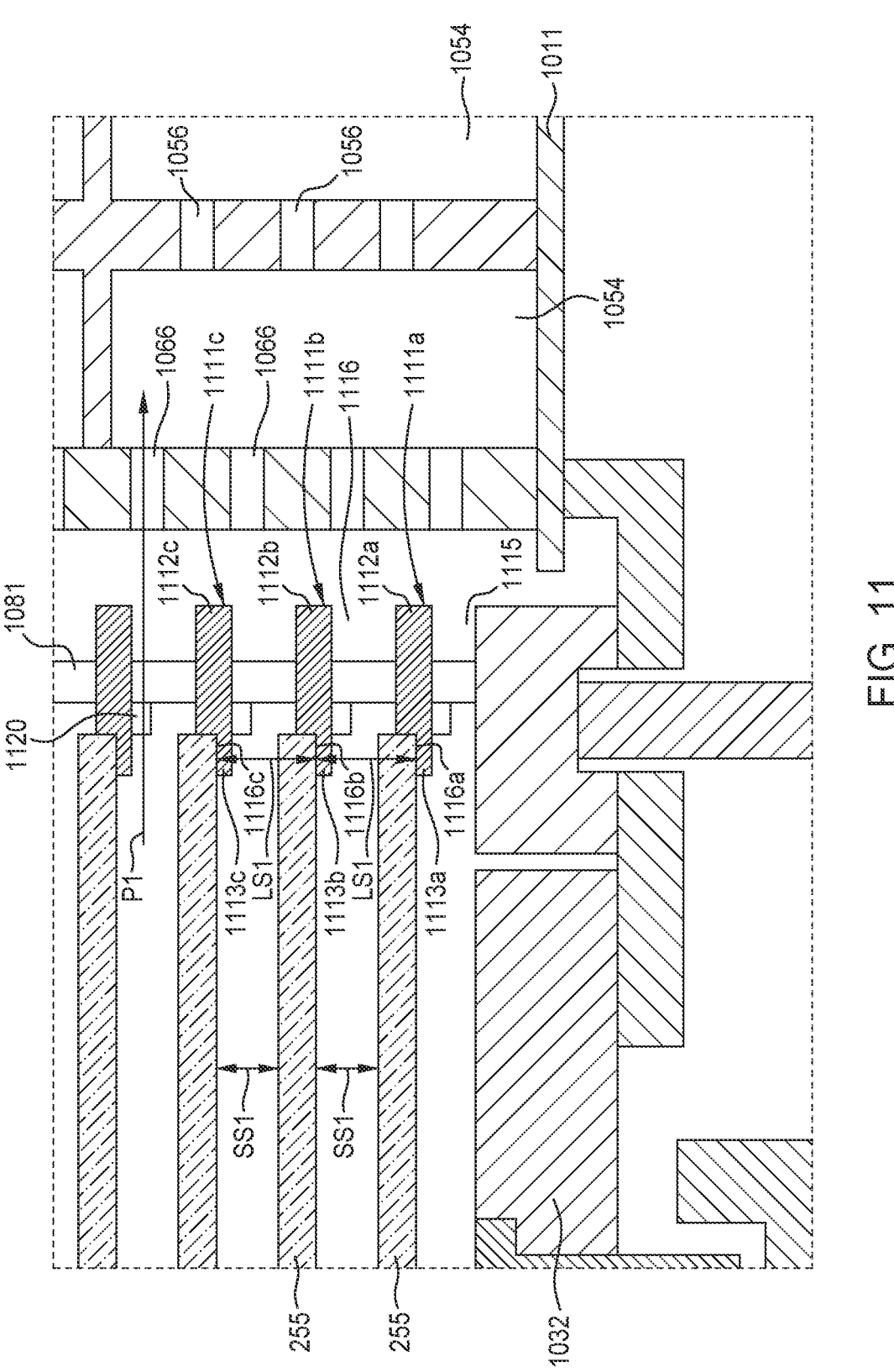
FIG. 11 is an enlarged view of the schematic cross-sectional side view of the processing apparatus shown in FIG. 10, according to one implementation.

FIG. 11 is an enlarged view of the schematic cross-sectional side view of the processing apparatus 1000 shown in FIG. 10, according to one implementation.

The cassette 1030 includes a plurality of levels 1111 positioned between the first cassette plate 1032 and the second cassette plate 1031.

Each level 1111 includes an arcuate support 1112 having one or more inner ledges 1113 that support a substrate 255. A section of the cassette 1030 is shown in FIG. 11. The cassette 1030 includes a first level 1111a that includes a first arcuate support 1112a having a first inner ledge 1113a, and a second level 111b that includes a second arcuate support 1112b having a second inner ledge 1113b. The first arcuate support 1112a and the second arcuate support 1112b are positioned between the first cassette plate 1032 and the second cassette plate 1031.

The cassette 1030 includes a first opening 1115 on an outer side of the first arcuate support 1112a, a second opening 1116 between the first arcuate support 1112a and the second arcuate support 1112b. A level spacing LS1 between the first level 1111a and the second level 1111b is 15 mm or higher. The level spacing LS1 is defined between a first support surface 1116a of the first inner ledge 1113a and a second support surface 1116b of the second inner ledge 1113b. In one or more embodiments, the level spacing LS1 is 25 mm or higher. In one or more embodiments, the level spacing LS1 is within a range of 38 mm to 52 mm. In one or more embodiments, the level spacing LS1 is within a range of 40 mm to 70 mm.

The level spacing LS1 can be used between each of the plurality of levels 1111. As an example, the cassette 1030 includes a third level 1111c that includes a third arcuate support 1112c positioned between the second arcuate support 1112b and the second cassette plate 1031. The third arcuate support 1112c has a third inner ledge 1113c. The level spacing LS1 is between the third arcuate support 1112c and the second arcuate support 1112b.

A substrate spacing SS1 can be used between each of two adjacent substrates 255. The substrate spacing SS1 is defined between outer surfaces of the substrates that face each other. In one or more embodiments, the substrate spacing SS1 between two adjacent substrates 255 is equal to the level spacing LS1 minus a thickness of one of the substrates 255 (such as the lower substrate 255 of the two substrates 255). In one or more embodiments, the thickness is about 0.75 mm. Other thickness values are contemplated. In one or more embodiments, the substrate spacing SS1 is a ratio of a diameter of one of the substrates (such as the lower substrate 255 of the two substrates 255), and the ratio is 1:12 or higher. In one or more embodiments, the ratio is within a range of 1:8 to 1:5.7. In one or more embodiments, the substrate spacing SS1 is 15 mm or higher. In one or more embodiments, the substrate spacing SS1 is 25 mm or higher. In one or more embodiments, the substrate spacing SS1 is within a range of 38 mm to 72 mm, such as within a range of 38 mm to 52 mm.

The level spacing LS1 and/or the substrate spacing SS1 facilitate increased growth rates of deposited films, enhanced processing uniformity, and processing adjustability while facilitating reduced processing times (e.g., cycle times), increased chamber capacity, and reduced dimensions and footprints (e.g., of chambers).

Each of the shield inlet openings 1065 and each of the shield outlet openings 1066 is aligned between two respective arcuate supports 1112 (as shown for the shield outlet openings 1066 in FIG. 11). The positions of the shield inlet openings 1065 and the shield outlet openings 1066 facilitate separately providing the one or more process gases P1 to gaps between adjacent substrates 255, which facilitates processing uniformity and processing adjustability.

The cassette 1030 includes a plurality of mount columns 1081 extending through the arcuate supports 1112 (including the first arcuate support 1112a, the second arcuate support 1112b, and the third arcuate support 1112c).

Figure 12:
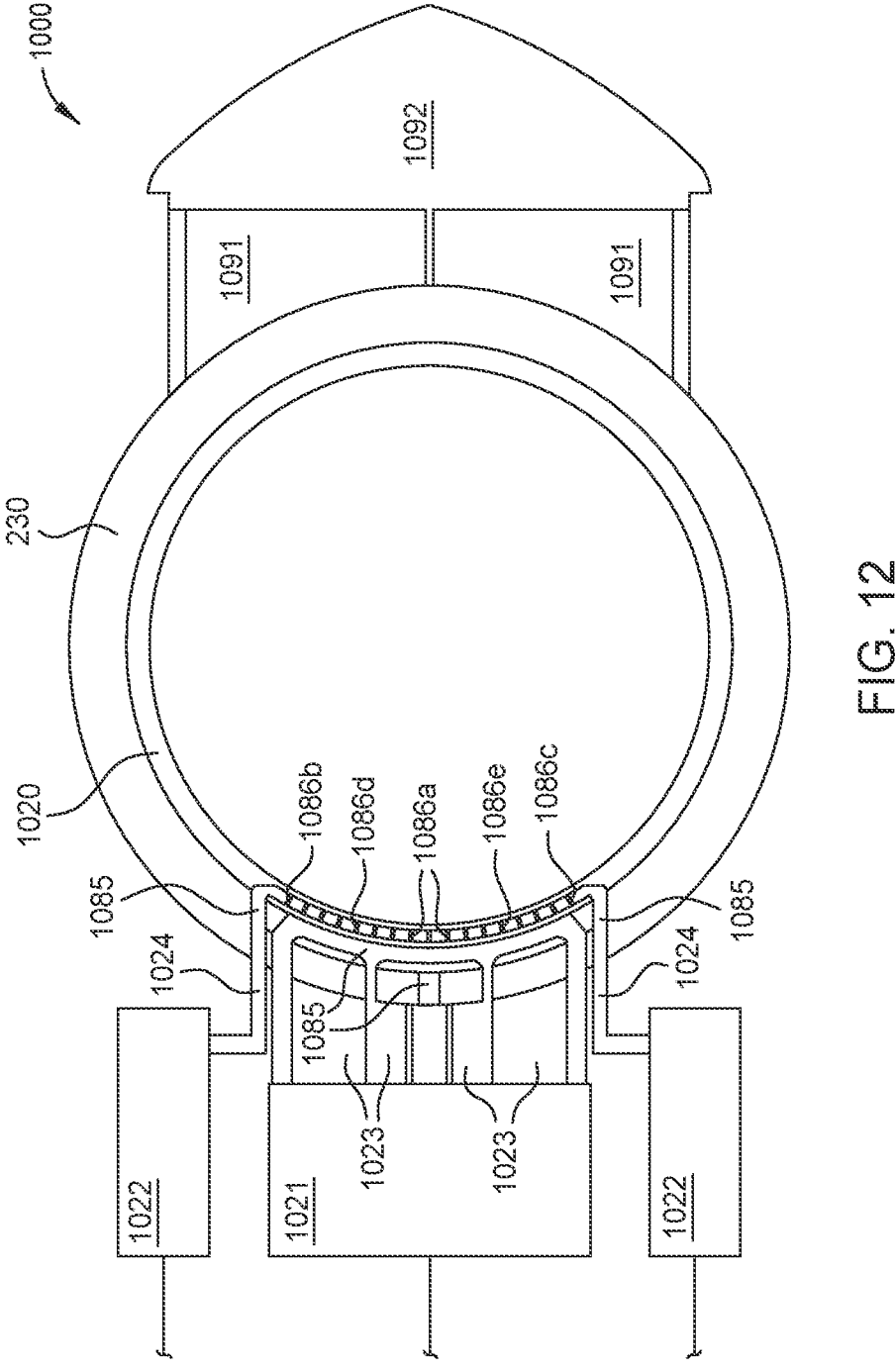
FIG. 12 is a schematic top view of the processing apparatus shown in FIGS. 10 and 11, according to one implementation.

Each mount column 1081 of the plurality of mount columns 1081 includes ledge interfaces between the respective mount column and the arcuate supports 1112. In one or more embodiments, ledges 1120 can extend outwardly relative to the mount columns 1081. In one or more embodiments, ledges can extending inwardly relative to inner faces of the arcuate supports 1112, such as into grooves formed in outer faces of the mount columns 1081. The ledges 1120 can include, for example, one or more pins or one or more arcuate ring segments. FIG. 12 is a schematic top view of the processing apparatus 1000 shown in FIGS. 10 and 11, according to one implementation.

The gas inject passages 1082 of each inject level include one or more central gas openings 1086a, one or more first outer gas openings 1086b on a first side of the one or more central gas openings 1086a, and one or more second outer gas openings 1086c on a second side of the one or more central gas openings 1086a. The gas inject passages 1082 of each inject level include one or more first intermediate gas openings 1086d between the one or more central gas openings 1086a and the one or more first outer gas openings 1086b, and one or more second intermediate gas openings 1086e between the one or more central gas openings 1086a and the outer gas openings 1086b, 1086c correspond to two edge zones of the substrate.

The gas openings 1086a-1086e correspond to five flow zones of control and adjustability for each substrate. As an example, the one or more central gas openings 1086a correspond to a center zone of the substrate and the other numbers of flow zones (such as up to ten flow zones or more) are contemplated.

Figure 13:
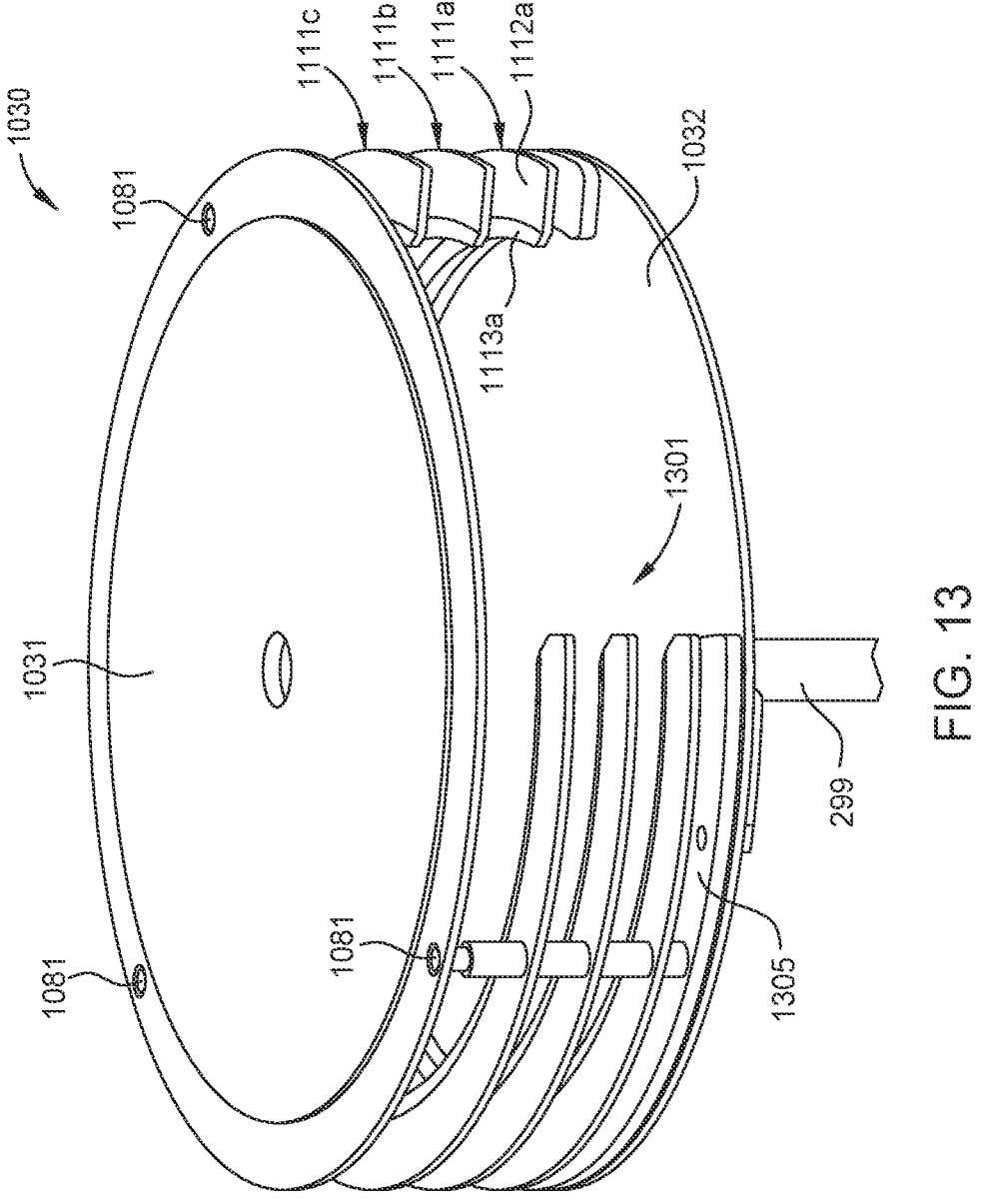
FIG. 13 is a schematic perspective view of the cassette shown in FIGS. 10 and 11, according to one implementation.

FIG. 13 is a schematic perspective view of the cassette 1030 shown in FIGS. 10 and 11, according to one implementation. In the implementation shown in FIG. 10, the cassette 1030 includes twelve levels 1111 that support twelve substrates 255. In the implementation shown in FIG. 13, the cassette 1030 includes three levels 1111 configured to support up to three substrates 255 during simultaneous processing. The present disclosure contemplates varying numbers of levels 1111 (such as two) for the cassette 1030 to support varying numbers of substrates (such as two).

Each of the arcuate supports 1112 of the levels 1111 is a ring or one or more ring segments. In implementation shown in FIG. 13, each arcuate support 1112 includes a gap 1301 such that each arcuate support 1112 is a single C-ring segment. The cassette 1030 includes a base segment 1305, and arms of the second support frame 299 can be coupled to the base segment 1305 through the first cassette plate 1032. The first cassette plate 1032 can be a single piece, or can include a plurality of pieces (such as the two pieces 1032a, 1032b shown in FIG. 10). The mount columns 1081 extend at least partially through the second cassette plate 1031 at a first end and extend at least partially through the base segment 1305 at a second end.

Figure 14:
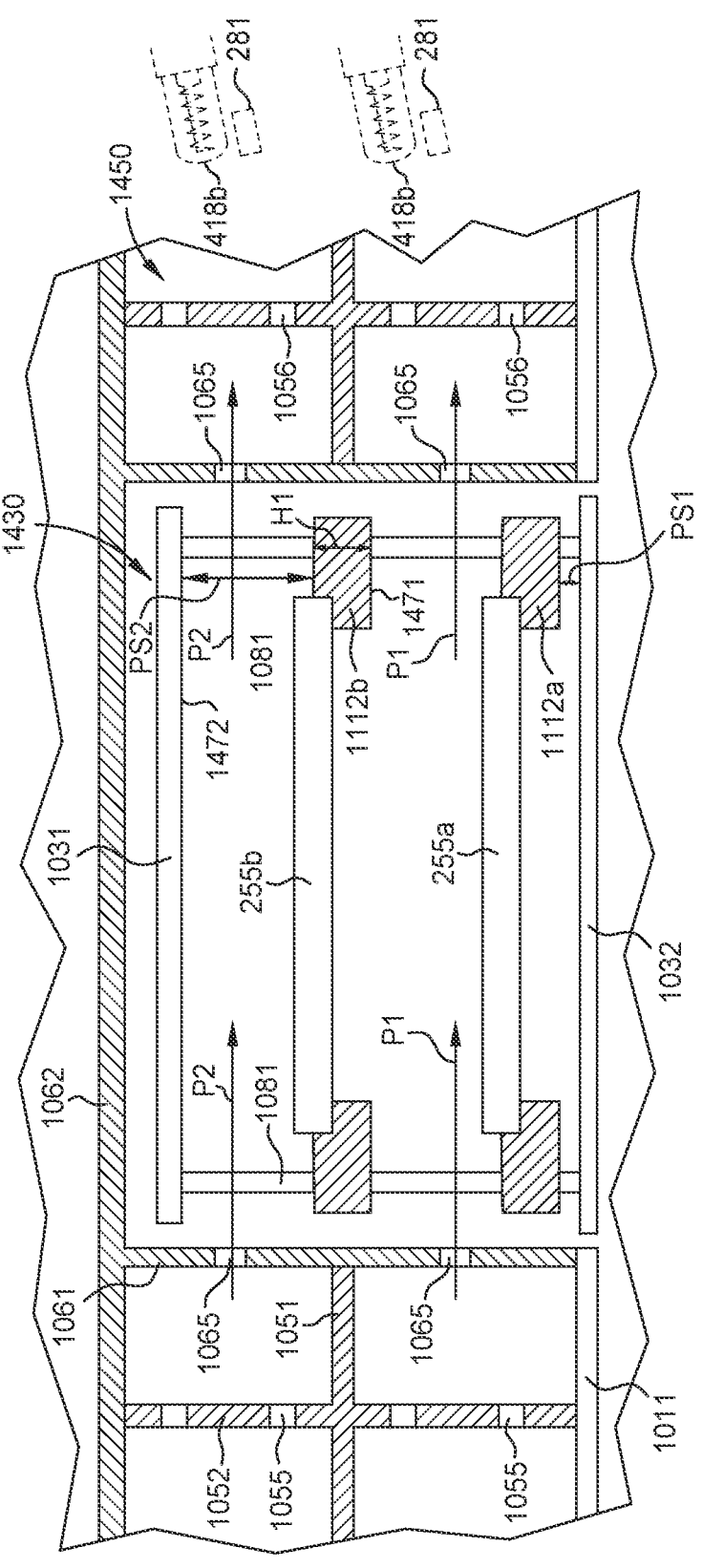
FIG. 14 is a schematic partial cross-sectional side view of a cassette and a flow guide structure, according to one implementation.

FIG. 14 is a schematic partial cross-sectional side view of a cassette 1430 and a flow guide structure 1450, according to one implementation. The cassette 1430 has two levels that support two substrates 255a, 255b during processing. The flow guide structure 1450 includes a single first flow divider 1051. Using the first flow divider 1051, the flow guide structure 1450 provides two separate flows of processing gases (which can be the same or different processing gases), one flow to each of the two substrates 255a, 255b. As an example, the flow guide structure 1450 can provide a first processing gas P1 to flow over a first substrate 255a, and a second processing gas P2 to flow over a second substrate 255b.

For each level of the cassette 1430, a ceiling (defining a ceiling of a gas flow path above the substrate corresponding to the level) is defined by a lower surface of a barrier above the level. In one or more embodiments, except for the uppermost level, the ceiling for each level of the cassette 1430 can defined by a lower surface 1471 of an adjacent support (such as the arcuate support 1112b) that is above the level, and/or a lower surface of a substrate (such as the substrate 255b) that is supported by the adjacent support. Other barriers are contemplated. For the uppermost level, a ceiling can be defined by a lower surface 1472 of the second cassette plate 1031 or other barrier. The first plate 1032 is positioned at a first plate spacing PS1 from the lowermost support 1112a, and the second cassette plate 1031 is positioned at a second plate spacing PS2 from the uppermost support 1112b. In one or more embodiments, one or more of the first plate spacing PS1 and/or the second plate spacing PS2 is equal to the level spacing LS1 minus a height H1 of the supports 1112a, 1112b. The present disclosure contemplates that the first cassette plate 1032 can be omitted such that the second cassette plate 1031 can be referred to as a cassette plate or a first cassette plate.

In one or more embodiments, the first cassette plate 1032 is used when the second cassette plate 1031 is formed of an opaque material.

In one or more embodiments, the cassettes described herein (such as the cassette 1430 and/or the cassette 230) can include a total of two levels (supporting a total of two substrates) or a total of three levels (supporting a total of three substrates) to facilitate enhanced deposition uniformity and device performance while facilitating increased throughput at low chamber dimensions and footprints.

Figure 15:
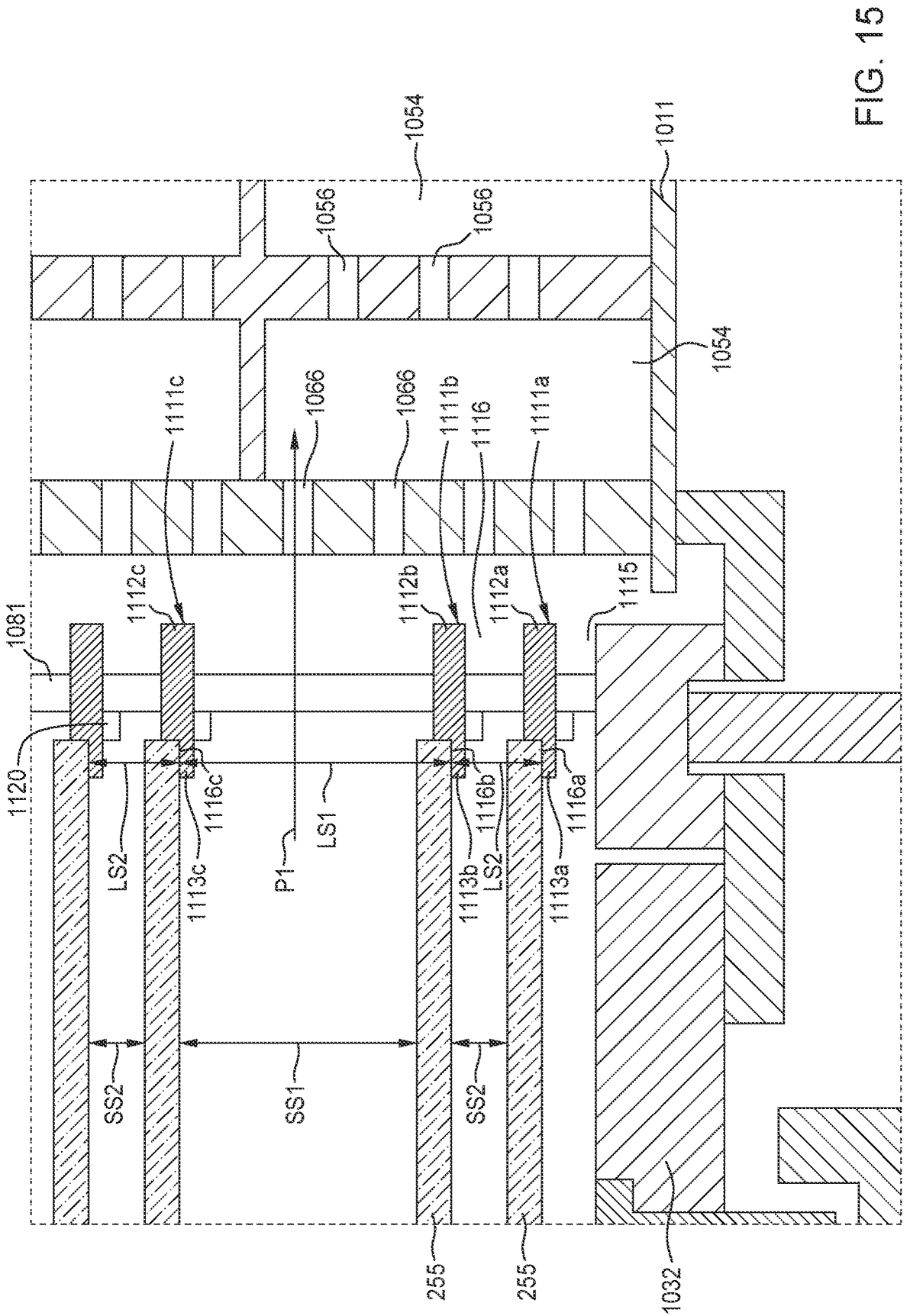
FIG. 15 is an enlarged view of the schematic cross-sectional side view of the processing apparatus shown in FIG. 10, according to one implementation.

FIG. 15 is an enlarged view of the schematic cross-sectional side view of the processing apparatus 1000 shown in FIG. 10, according to one implementation. In the implementation shown in FIG. 15, the cassette 1030 includes a total of four levels 1111*a*-1111*d* that support a total of four substrates 255. A second level spacing LS2 and a substrate spacing SS2 are used for the two outermost substrates 255. The level spacing LS1 and the substrate spacing SS1 are used for inner substrates 255. The second level spacing LS2 is less than the level spacing LS1, and the second substrate spacing SS2 is less than the substrate spacing SS1. In one or more embodiments, the level spacing LS1 is two to three times greater than the second level spacing LS2, and/or the substrate spacing SS1 is two to three times greater than the second substrate spacing SS2.

Figure 16:
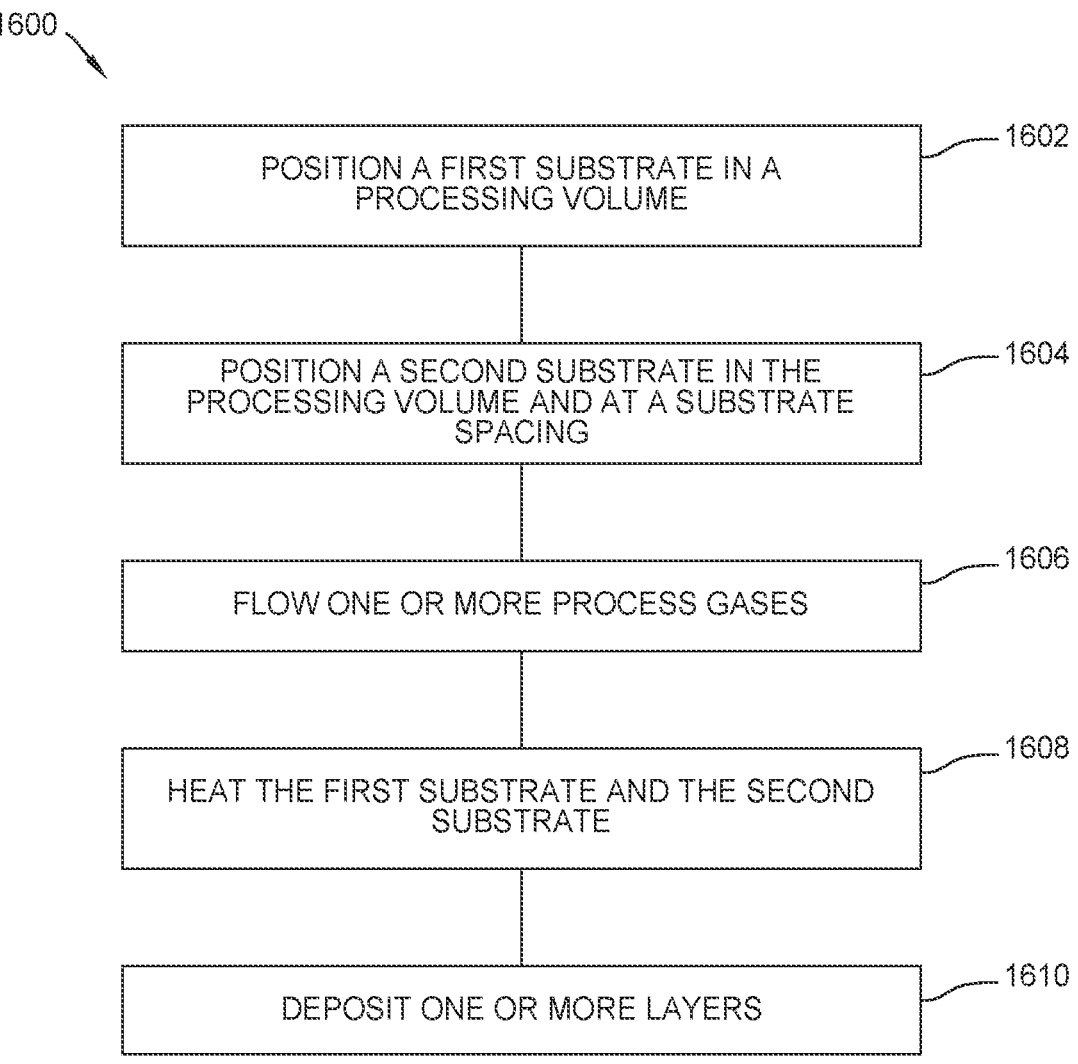
FIG. 16 is a schematic diagram view of a method of processing a plurality of substrates, according to one implementation.

FIG. 16 is a schematic diagram view of a method 1600 of processing a plurality of substrates, according to one implementation.

Operation 1602 of the method 1600 includes positioning a first substrate in a processing volume of a chamber. The first substrate has a diameter.

Operation 1604 includes positioning a second substrate in the processing volume and at a substrate spacing SS1 from the first substrate. In one or more embodiments, the substrate spacing SS1 is a ratio of the diameter of the first substrate.

Operation 1606 includes flowing one or more process gases into the processing volume.

Operation 1608 includes heating the first substrate and the second substrate. It is contemplated that operation 1608 may occur prior to, subsequent to, or concurrent with operation 1606.

Operation 1610 includes simultaneously depositing one or more layers on each of the first substrate and the second substrate. In one or more embodiments, the one or more layers are simultaneously deposited on each of the first substrate and the second substrate at an average growth rate that is 10 Angstroms/second or higher.

Figure 17:
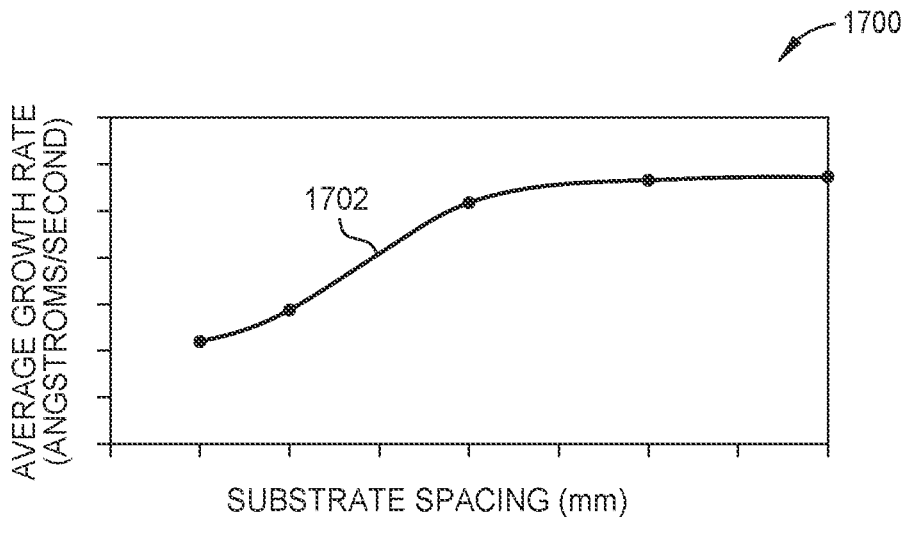
FIG. 17 is a schematic view of a graph plotting average growth rate versus substrate spacing, according to one implementation.

FIG. 17 is a schematic view of a graph 1700 plotting average growth rate versus substrate spacing, according to one implementation.

As shown by a profile 1702, average growth rate (such as epitaxial growth rate) can increase as substrate spacing increases. After a certain point, increases in substrate spacing do not necessarily have corresponding increases in average growth rates.

Using subject matter described herein (such as the level spacing LS1 and/or the substrate spacing SS1), high average growth rates are facilitated while facilitating process adjustability and reduced dimensions and footprints (e.g., of chambers).

Figure 18:
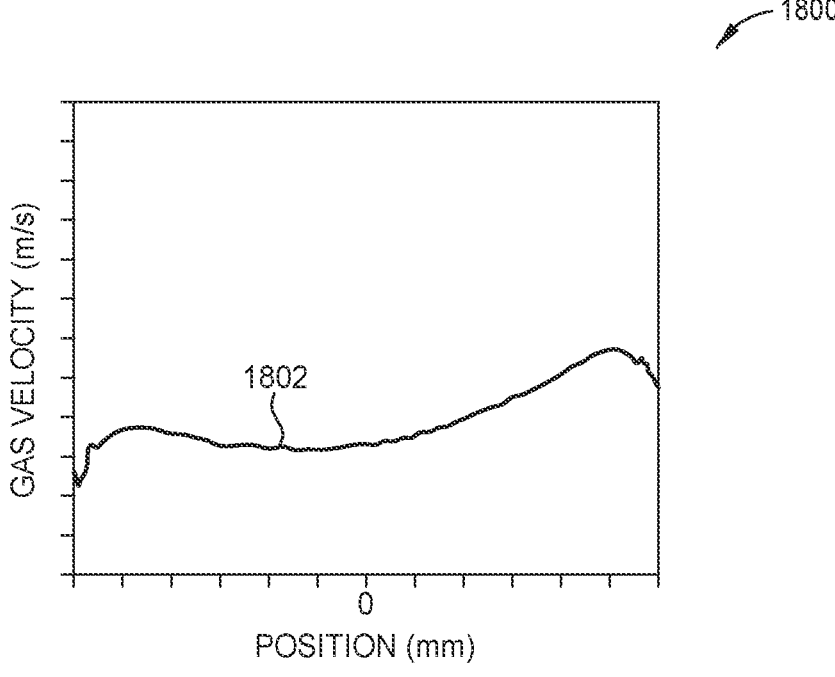
FIG. 18 is a schematic view of a graph plotting gas velocity versus position over a substrate, according to one implementation.

FIG. 18 is a schematic view of a graph 1800 plotting gas velocity versus position over a substrate, according to one implementation. The position refers to a position along a diameter of the substrate, with "0" representing a center of the substrate. A shown by a profile 1802, the gas velocity is relatively continuous across the diameter of the surface of the substrate, such as from a leading edge of the substrate to the center of the substrate.

Using subject matter described herein (such as the level spacing LS1 and/or the substrate spacing SS1), more continuous gas flow rates are facilitated for gases flowing over surfaces of substrates.

Figure 19:
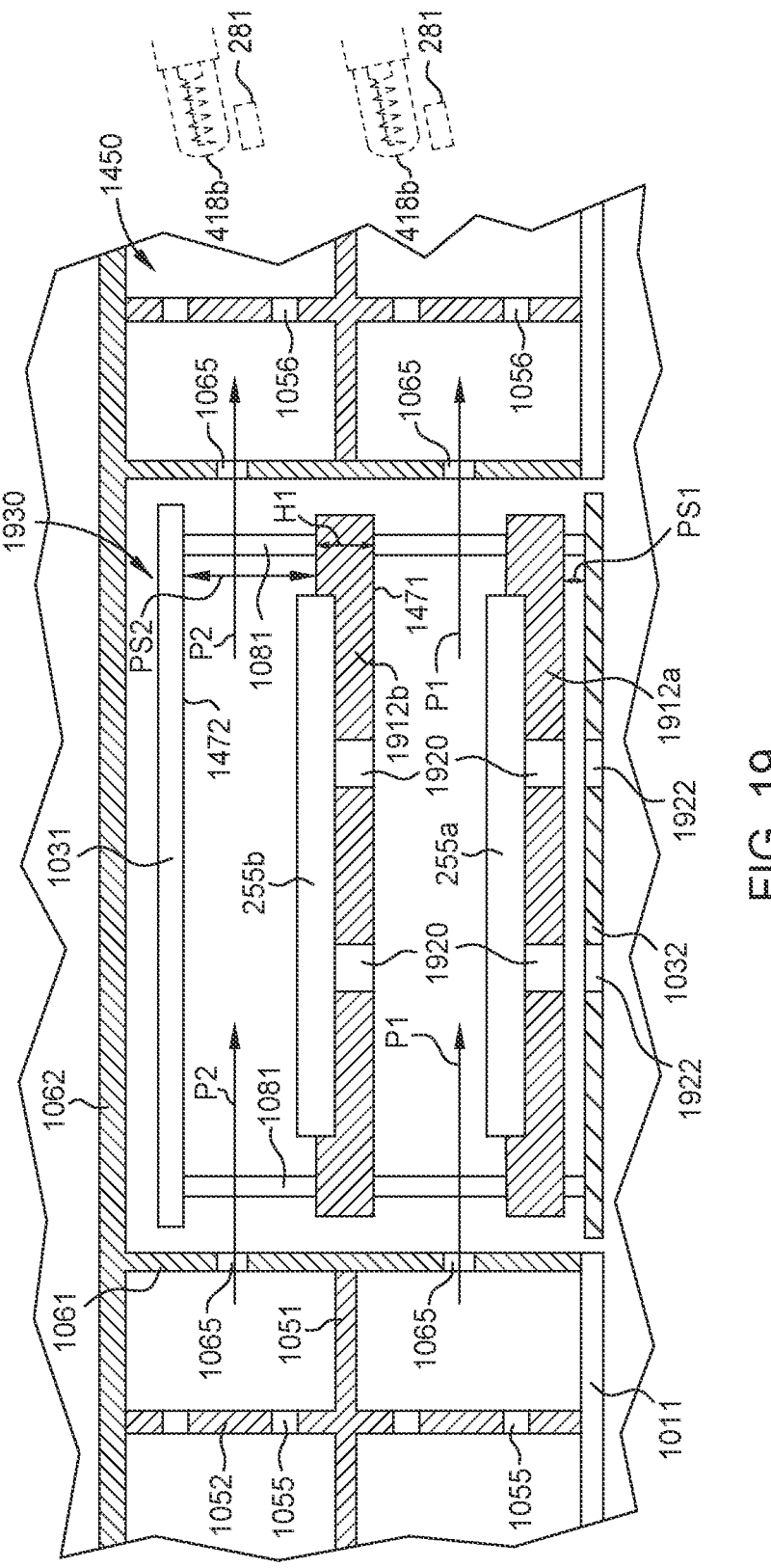
FIG. 19 is a schematic partial cross-sectional side view of a cassette 1930 and the flow guide structure shown in FIG. 14, according to one implementation.

FIG. 19 is a schematic partial cross-sectional side view of a cassette 1930 and the flow guide structure 1450 shown in FIG. 14, according to one implementation. The two supports of the cassette 1930 each include a susceptor 1912*a*, 1912*b* that supports a respective substrate 255*a*, 255*b*. Each susceptor 1912*a* 1912*b* includes pin openings 1920, through which the lift pins 289 can pass to contact and lift the substrates 255*a*, 255*b*.

Benefits of the present disclosure include reduced processing times, increased chamber capacity, increased growth rates of deposited films, enhanced device performance, more continuous gas velocities of gases flowing over substrates, more uniform device performance across a plurality of substrates, more uniform and stable thermal processing across a plurality of substrates, increased throughput, and reduced dimensions and footprint (e.g., of chambers). Benefits also include uniform adjustability, such as processing temperature control and adjustability, gas parameter control and adjustability, and substrate center-to-edge control and adjustability. Benefits also include enhanced device performance and modularity in application. As an example, batch processing can be used for relatively complex epitaxial deposition operations at relatively smaller footprints, relatively larger throughputs, while maintaining or enhancing growth rates and maintaining or enhancing device performance. Such benefits can be facilitated, for example, for inner substrates that are not the outermost substrates of a plurality of substrates supported on a cassette.

Such benefits of the present application are facilitated by implementations of the present disclosure. It is contemplated that aspects described herein can be combined. For example, one or more features, aspects, components, operations, and/or properties of the system 100, the processing apparatus 200, the chamber body 230, the chamber body 390, the chamber body 430*a*, the chamber body 430*b*, the chamber body 430*c*, the chamber body 430*d*, the processing apparatus 600, the processing apparatus 700, the method 800, the single upper window assembly 900, the processing apparatus 1000, the cassette 1030, the flow guide structure 1050, the cassette 1430, the flow guide structure 1450, and/or the method 1600 can be combined. It is further contemplated that any combination(s) can achieve the aforementioned benefits.

While the foregoing is directed to embodiments of the present disclosure, other and further embodiments of the disclosure may be devised without departing from the basic scope thereof, and the scope thereof is determined by the claims that follow.

What is claimed is:

1. An apparatus for substrate processing, comprising:
   a chamber body comprising:
     a processing volume,
     a plurality of gas inject passages formed in the chamber body and in fluid communication with the processing volume, and
     one or more gas exhaust passages formed in the chamber body opposite the plurality of gas inject passages, the one or more gas exhaust passages in fluid communication with the processing volume; and one or more heat sources configured to generate heat;

a pedestal assembly positioned in the processing volume; and a cassette positioned in the processing volume and at least partially supported by the pedestal assembly, the cassette comprising:

a plurality of levels arranged vertically with respect to each other, each level of the plurality of levels comprising a support surface configured to support a substrate, wherein a level spacing between adjacent levels of the plurality of levels is within a range of 40 mm to 70 mm, the level spacing is defined between the support surfaces of the adjacent levels, and a number of levels in the plurality of levels is a total of two or three.

2. The apparatus of claim 1, wherein each level of the plurality of levels comprises a susceptor having pin openings.

3. The apparatus of claim 1, wherein the plurality of levels comprise:

a first level comprising a first arcuate support having a first inner ledge, the first inner ledge having a first support surface, and a second level comprising a second arcuate support having a second inner ledge, the second inner ledge having a second support surface, wherein a first opening is on an outer side of the first arcuate support and a second opening is between the first arcuate support and the second arcuate support, wherein each of the first arcuate support and the second arcuate support is a ring or one or more ring segments, and the cassette further comprises a plurality of mount columns extending through the first arcuate support and the second arcuate support.

4. The apparatus of claim 3, wherein the cassette further comprises:

a cassette plate positioned at a plate spacing from the second arcuate support, wherein the plate spacing is equal to the level spacing minus a height of the second arcuate support.

5. The apparatus of claim 3, wherein the cassette further comprises:

a third level comprising a third arcuate support having a third inner ledge, the third inner ledge having a third support surface wherein a second level spacing between the second level and the third level is less than the level spacing, and the second level spacing is defined between the second support surface of the second inner ledge and the third support surface of the third inner ledge.

6. The apparatus of claim 1, further comprising:

a plurality of side sensors configured to measure temperatures within the processing volume from a side of the processing volume, wherein the plurality of side sensors are arranged in a plurality of sensor levels corresponding to the plurality of levels of the cassette such that one or more side sensors correspond to each level of the cassette.

7. The apparatus of claim 1, wherein the chamber body is a dual-chamber body, the processing volume is on a first side of a reference plane, and the dual-chamber body further comprises a second processing volume on a second side of the reference plane, and apparatus further comprises:

a second pedestal assembly positioned in the second processing volume; and a second cassette positioned in the second processing volume and at least partially supported by the second pedestal assembly, the second cassette comprising:

a plurality of second levels arranged vertically with respect to each other, each second level of the plurality of second levels comprising a second support surface configured to support a second substrate, wherein a second level spacing between adjacent second levels of the plurality of second levels is 25 mm or higher, and the second level spacing is defined between the second support surfaces of the adjacent second levels.

8. An apparatus for substrate processing, comprising:

a chamber body comprising:

a processing volume, a plurality of gas inject passages formed in the chamber body, the plurality of gas inject passages positioned as a plurality of inject levels, and the gas inject passages of each inject level comprising:

one or more central gas openings, one or more first outer gas openings on a first side of the one or more central gas openings, one or more second outer gas openings on a second side of the one or more central gas openings one or more first intermediate gas openings between the one or more central gas openings and the one or more first outer gas openings, and one or more second intermediate gas openings between the one or more central gas openings and the one or more second outer gas openings and one or more gas exhaust passages formed in the chamber body opposite the plurality of gas inject passages;

one or more heat sources configured to generate heat;

a pedestal assembly positioned in the processing volume; and a flow guide structure positioned in the processing volume, the flow guide structure comprising:

one or more first flow dividers that divide the processing volume into a plurality of flow levels, each inject level aligning with a respective flow level, and one or more second flow dividers oriented to intersect the one or more first flow dividers and divide each flow level of the plurality of flow levels into a plurality of flow sections, the gas inject passages of each inject level are open to an outermost flow section of the respective flow level.

9. The apparatus of claim 8, further comprising one or more liners configured to line one or more sidewalls of the chamber body, wherein the one or more first flow dividers are coupled to the one or more liners.

10. The apparatus of claim 9, further comprising a heat shield structure positioned in the processing volume, the heat shield structure comprising:

a first shield plate positioned inwardly of the one or more second flow dividers; and a second shield plate oriented to intersect the first shield plate and supported at least partially by the one or more liners.

11. The apparatus of claim 10, wherein:

each of the one or more second flow dividers comprises a plurality of divider inlet openings and a plurality of divider outlet openings formed therein; and the first shield plate comprises a plurality of shield inlet openings and a plurality of shield outlet openings formed therein.

12. The apparatus of claim 11, wherein the plurality of divider inlet openings are offset from the plurality of shield inlet openings.

13. The apparatus of claim 10, further comprising a cassette positioned inwardly of the first shield plate and at least partially supported by the pedestal assembly, the cassette comprising:

a first level comprising a first support surface configured to support a first substrate; and a second level comprising a second support surface configured to support a second substrate, wherein a level spacing between the first level and the second level is 25 mm or higher, and the level spacing is defined between the first support surface and the second support surface.

14. The apparatus of claim 10, wherein each of the one or more first flow dividers, the one or more second flow dividers, the first shield plate, and the second shield plate is formed of one or more of quartz, silicon carbide (SiC), or graphite coated with SiC).

15. An apparatus for substrate processing, comprising:

a chamber body comprising:

a processing volume, a plurality of gas inject passages formed in the chamber body and in fluid communication with the processing volume, and one or more gas exhaust passages formed in the chamber body opposite the plurality of gas inject passages, the one or more gas exhaust passages in fluid communication with the processing volume; and one or more heat sources configured to generate heat;

a pedestal assembly positioned in the processing volume; and a cassette positioned in the processing volume and at least partially supported by the pedestal assembly, the cassette comprising:

a plurality of levels arranged vertically with respect to each other, each level of the plurality of levels comprising a support surface configured to support a substrate, the plurality of levels comprising:

a first level comprising a first arcuate support having a first inner ledge, the first inner ledge having a first support surface, and a second level comprising a second arcuate support having a second inner ledge, the second inner ledge having a second support surface, each of the first arcuate support and the second arcuate support is a ring or one or more ring segments, and a plurality of mount columns extending through the first arcuate support and the second arcuate support, wherein a first opening is on an outer side of the first arcuate support and a second opening is between the first arcuate support and the second arcuate support, wherein a level spacing between adjacent levels of the plurality of levels is 25 mm or higher, and the level spacing is defined between the support surfaces of the adjacent levels.

16. The apparatus of claim 15, wherein the cassette further comprises:

a cassette plate positioned at a plate spacing from the second arcuate support, wherein the plate spacing is equal to the level spacing minus a height of the second arcuate support.

17. The apparatus of claim 15, wherein the cassette further comprises:

a third level comprising a third arcuate support having a third inner ledge, the third inner ledge having a third support surface, wherein a second level spacing between the second level and the third level is less than the level spacing, and the second level spacing is defined between the second support surface of the second inner ledge and the third support surface of the third inner ledge.

18. The apparatus of claim 15, further comprising:

a plurality of side sensors configured to measure temperatures within the processing volume from a side of the processing volume, wherein the plurality of side sensors are arranged in a plurality of sensor levels corresponding to the plurality of levels of the cassette such that one or more side sensors correspond to each level of the cassette.

19. The apparatus of claim 15, further comprising a flow guide structure positioned in the processing volume, the flow guide structure comprising:

one or more first flow dividers that divide the processing volume into a plurality of flow levels, and one or more second flow dividers oriented to intersect the one or more first flow dividers and divide each flow level of the plurality of flow levels into a plurality of flow sections, each of the one or more second flow dividers comprises a plurality of divider inlet openings and a plurality of divider outlet openings formed therein.

20. The apparatus of claim 15, further comprising a heat shield structure positioned in the processing volume, the heat shield structure comprising:

a first shield plate positioned inwardly of the one or more second flow dividers, the first shield plate comprising a plurality of shield inlet openings and a plurality of shield outlet openings formed therein; and a second shield plate oriented to intersect the first shield plate.

* * * * *